United States Patent [19]

Sano et al.

[11] Patent Number: 5,304,946
[45] Date of Patent: Apr. 19, 1994

[54] AMPLIFIER CIRCUIT HAVING AN OPERATION POINT MAINTAINING INPUT AND OUTPUT VOLTAGES CONSTANT EVEN IF A GAIN THEREOF IS VARIED

[75] Inventors: Yuji Sano, Zushi; Michitaka Ohsawa, Fujisawa, both of Japan

[73] Assignee: Hitachi, Ltd., Tokyo, Japan

[21] Appl. No.: 779,236

[22] Filed: Oct. 18, 1991

[30] Foreign Application Priority Data

Oct. 19, 1990 [JP] Japan .................................. 2-278986

[51] Int. Cl.⁵ ............................................. H03G 3/14
[52] U.S. Cl. .................................... 330/254; 330/283; 330/311; 348/707
[58] Field of Search .............. 330/254, 283, 284, 311, 330/310; 358/184

[56] References Cited

U.S. PATENT DOCUMENTS

| | | | |
|---|---|---|---|
| 3,426,288 | 2/1969 | Giorgetti | 330/171 X |
| 3,512,096 | 5/1970 | Nagata et al. | 330/284 |
| 4,079,336 | 3/1978 | Gross | 330/311 X |
| 4,229,707 | 10/1980 | Suganuma | 330/283 X |
| 4,345,217 | 8/1982 | Pace | 330/311 X |
| 4,426,625 | 1/1984 | Harwood et al. | 330/254 |
| 4,479,094 | 10/1984 | Harris | 330/311 X |
| 4,757,276 | 7/1988 | Ishii et al. | 330/311 X |
| 4,858,015 | 8/1989 | Furrey | 358/184 X |

FOREIGN PATENT DOCUMENTS

| | | | |
|---|---|---|---|
| 2300296 | 9/1973 | Fed. Rep. of Germany | 330/283 |
| 44312 | 3/1982 | Japan | 330/284 |
| 85611 | 5/1985 | Japan | 330/283 |
| 167723 | 7/1959 | Sweden | 330/310 |
| 1141561 | 2/1985 | U.S.S.R. | 330/311 |

Primary Examiner—James B. Mullins
Attorney, Agent, or Firm—Antonelli, Terry, Stout & Kraus

[57] ABSTRACT

An amplifier circuit includes a grounded-collector circuit for converting an input signal voltage into a first signal current, a second transistor circuit for transmitting the first signal current to an output side, a variable impedance for converting the first signal current transmitted to the output side into a voltage, and a circuit block having a voltage generation circuit connected in series to the variable impedance. A transistor constituting the grounded-collector circuit has a collector connected to a junction of the voltage generation circuit and the variable impedance and an emitter connected to an input side of the second transistor. The amplifier circuit has an operation point in which input and output voltages are maintained constant even if a gain is varied.

43 Claims, 16 Drawing Sheets

AMPLIFIER CIRCUIT HAVING AN OPERATION POINT MAINTAINING INPUT AND OUTPUT VOLTAGES CONSTANT EVEN IF A GAIN THEREOF IS VARIED

BACKGROUND OF THE INVENTION

The present invention relates to an amplifier circuit and more particularly, to a variable gain circuit, a wideband circuit and a gain control circuit suitable for a video amplifier circuit for a CRT display.

A conventional video amplifier circuit for a color CRT display is shown in FIG. 3. In the circuit shown in FIG. 3, video signals for the three primary colors of R(red), G(green) and B(blue) are applied from signal sources 1R, 1G and 1B through video amplifier circuits 2R, 2G and 2B to cathodes 3R, 3G and 3B of a CRT display 4, respectively. The CRT 4 includes a first grid 40 shared by the signals of the three primary colors RGB.

Since the conventional amplifier circuits for the three primary colors have the same circuit configuration, description of the operation of only the amplifier circuit for the red color R is being presented for purposes of explanation. An input signal voltage $V_{IR}$ is applied to a base of a transistor 22R constituting a grounded-emitter amplifier circuit and is amplified by the transistor so that an inverted output signal voltage $V_{OR}$ is produced at its collector and is supplied to the cathode 3R of the CRT 4, An operation point of the output signal voltage $V_{OR}$ in this case is adjusted by using a variable resistor 27R for adjustment of cut-off, and a voltage gain is adjusted by using a variable resistor 23R for adjustment of drive. A range of adjustment for the operation point of the output signal voltage is limited by a resistor 26R. A resistor 24R limits the voltage gain adjustment range in the same manner as the resistor 26R and also compensates for the frequency characteristic of the video amplifier circuit 2R at the same time. The frequency band of the video amplifier circuit 2R is mainly limited by a load capacitance 30 and a collector resistor 21R and is $1/(2\pi C_L R_{CR})$ when the frequency characteristic is not compensated for. The frequency characteristic is improved in excess of the frequency determined by a time constant defined by the resistor 24R and an emitter peaking capacitor 25R added to suppress the band limitation. However, the upper limit of the frequency band increased by the improved frequency characteristic is reduced in inverse proportion to increase of a signal amplitude.

Adjustment of the white balance in the prior art is attained by repeatedly performing the cut-off adjustment of the primary color circuits and the drive adjustment of the video amplifier circuit for at least two primary colors.

An example of a conventional wideband circuit is now shown in FIG. 14. The circuit shown in FIG. 14 is named a cascode amplifier circuit and is advantageous in that the Miller effect occurring in a grounded-emitter transistor 22 of a first stage is suppressed. More particularly, with a mere grounded-emitter configuration, a collector voltage of the transistor 22 is swung to a voltage gain Av times a base voltage in an inverted direction. Generally, a signal source 1 is regarded as a series circuit of a signal voltage source 1v and a signal source resistor 1r. Accordingly, an input capacitance of a base terminal of the transistor 22 is substantially equal to a value of $(1+Av)$ times a value $C_{BC2}$ of a capacitance 210 between the base and the collector thereof and a time constant on the side of the input terminal determined by the capacitance value of the base terminal and a value rs of the signal source resistor 1r is increased so that the frequency band of the circuit is narrowed. Thus, as shown in FIG. 14, the load of the grounded-emitter circuit is formed by a grounded-base circuit having a low input impedance and constituted of a transistor 208, so that a signal voltage appearing at the collector of the transistor 22 is suppressed. The input capacitance of the base terminal of the transistor 22 is a sum of the capacitance $C_{BC2}$ and an equivalent capacitance of a circuit including resistors 23 and 24 and a capacitor 25 connected to the emitter of the transistor 22 reflected to the base side of the transistor 22 through the transistor 22 and is a small value to an extent that the frequency characteristic is not adversely affected. Accordingly, the cascode amplifier circuit shown in FIG. 14 is widely applied to the video amplifier circuit and various wideband circuits including an integrated circuit as a circuit capable of spreading the frequency band sufficiently. In FIG. 14, a terminal 212 is an output terminal.

A wideband variable gain amplifier circuit is shown in FIG. 25A. In FIG. 25A, a signal current 98 converted by a transistor 92 and a resistor 97 from a voltage is divided by a fixed ratio set in transistors 93 and 94 constituting a differential pair to vary a gain. Thus, a signal Vi of an input signal source 1 is amplified and is outputted at output terminal 95 as output signal Vo. The division ratio in this case is constant regardless of a magnitude $i_s$ of the signal current 98 but, however, can be varied by adjusting a voltage $\Delta V_B$ of a differential pair control voltage source 9. Further, since the transistors 93 and 94 are configured as a grounded-base circuit in series connection with a grounded-emitter circuit constituted of the transistor 92, the circuit of FIG. 25A is considered to constitute a cascode amplifier circuit and can attain the wideband characteristic.

Adjustment process of the white balance in the prior art is described with reference to an input and output characteristic diagram, of a video amplifier circuit, shown in FIG. 4. In the characteristic diagram of FIG. 4, the abscissa represents an input signal voltage $V_I$ and the ordinate represents an output signal voltage $V_o$. A straight line 50 shown by a solid line represents an input and output characteristic in the case where the white balance to be targeted is ensured.

In the current adjustment of the white balance, the cut-off adjustment and the drive adjustment are made in the state where input signal voltages of FIG. 4 are $V_{IC}$ $V_{ID}$. If it is assumed that the video amplifier circuit has the characteristic shown by a broken line 51 at an initial state thereof, the output voltage $V_o$ is mainly shifted as shown by an arrow 52 by performing a first cut-off adjustment, so that the characteristic is shifted as shown by broken line 53. Adjustment of the voltage gain is made as shown by an arrow 54 in a next drive adjustment, so that the characteristic shown by a broken line 55 is obtained and a first adjustment of the white balance is finished. However, as apparent from an arrow 56 of FIG. 4, there is a problem that the precedingly performed cut-off adjustment is additionally shifted by the drive adjustment. Such interference between the cut-off adjustment and the drive adjustment in the prior art is now analyzed quantitatively. The video amplifier circuit for the red color R shown in FIG. 3 is taken up as a circuit example. When an output voltage at the time of the cut-off adjustment is $V_{OCR}$, and $V_0=V_{OCR}$, $V_1=V_{CC}$, $V_2=V_{ICR}$, $V_3=V_{BE22R}$, $V_4=V_{ER}$, $R_1=R_{CR}$ and $R_2=R_{ER}$, the output voltage can be expressed as follows:

$$V_o \approx V_1 - R_1 \cdot \frac{V_2 - V_3 - V_4}{R_2} \qquad (1)$$

where $V_{BE22R}$: voltage between the base and the emitter of the transistor 22R; and
$V_{ER}$: emitter equivalent voltage $$V_{ER} = \frac{R_{2R}(R_{23}+R_{24})V_E}{(R_{1R}+R_{2R})(R_{26}+(R_{1R}//R_{2R}))+R_{23}+R_{24}} \qquad (2)$$

$R_{ER}$: emitter equivalent resistance $$R_{ER} \approx (R_{23}+R_{24})//\{(R_{26}+(R_{1R}//R_{2R})\} \qquad (3)$$

where $R_1//R_{2R}$ represents a parallel resistance value $(R_{1R} \cdot R_{2R}/(R_{1R}+R_{2R}))$ of resistances $R_{1R}$ and $R_{2R}$, and a parallel resistance value is hereinafter expressed thereby similarly.

Further, when a voltage gain set by the drive adjustment is $A_{VR}$, the voltage gain is represented by $$A_{VR} \approx -\frac{R_{CR}}{R_{ER}} \qquad (4)$$

From the foregoing, it would be understood that the resistances $R_{1R}$ and $R_{2R}$ Set in the cut-Off adjustment and the resistance $R_{23}$ set in the drive adjustment exist together in the equations of $V_{ER}$ and $R_{ER}$ and the respective effects are preserved without canceling each other. Accordingly, since there is interference between the cut-off adjustment and the drive adjustment in the prior art, there is a problem that the adjustment of the white balance is not completed unless these adjustments are made repeatedly.

An example of the frequency characteristic at the input terminal of the cascode amplifier circuit of FIG. 14 is shown in FIG. 15. In the characteristic diagram of FIG. 15, the abscissa represents a signal frequency fs and the ordinate represents an amplitude $|V_B|$ of a signal at the base electrode of the transistor 22 which is an input terminal. As shown by a characteristic curve 213 of FIG. 15, a trap occurs in a frequency fr lower than a cut-off frequency $f_{CB}$ determined by the resistance $r_s$ of the signal source and the capacitance $C_{BC2}$ between the base and the collector of the transistor 22. In order to make clear the cause for the occurrence of the trap, the transistors 208 and 22 are expressed by a hybrid $\pi$-shaped equivalent circuit shown in FIG. 16 for analysis. In FIG. 16, $r_{bb}$ represents an inter base resistance, $r_E$ an emitter bulk resistance, $r_\pi$ an operation resistance between the base and the emitter, $C_\pi$ a diffusion capacitance, $C_\mu$ a capacitance between the base and the collector, $C_o$ a capacitance between the collector and the emitter, and $g_m$ a mutual conductance.

(1) An input impedance $Z_E$ as viewed from the emitter electrode of the grounded-base transistor 208 exhibits the inductivity as expressed by the following equation (5), where $\beta_0$ is a low-frequency current amplification factor.

$$Z_E \approx r_E + \frac{r_\pi}{1+\beta_0} + \frac{r_{bb}'}{\beta_0}\{1+j\omega(C_\pi r_\pi + C_\mu R_c)\} \qquad (5)$$

(2) An input impedance $Z_B$ of the grounded-emitter transistor 22 is proportional to a series impedance of a parallel capacitance $C_\mu$ and $C_O$ and a load impedance $Z_C$ connected to the collector electrode as shown in the following equation (6):

$$Z_B \approx \frac{\frac{1}{S(C_\mu+C_o)}+Z_c}{\frac{C_\mu}{C_\mu+C_o}\{1+Z_c(g_m+SC_o)\}} \qquad (6)$$

(3) From the above equations (1) and (2), it is considered that the trap occurs by a series resonance of an impedance component of the input impedance $Z_E$ of the transistor 208 and a parallel combined capacitance of the capacitance 210 between the base and the collector and a capacitance 211 of the collector and the emitter of the transistor 22. It has been confirmed by an experiment that the trap occurs in the vicinity of a resonance frequency fr expressed by the equation (7). However, all parameters of the equivalent circuit of the transistor in the equation (7) are values concerning the transistor 208.

$$fr \approx \frac{1}{2\pi\sqrt{\frac{r_{bb}'}{\beta_0}(C_\pi r_\pi + C_\mu R_c)(C_{BC2}+C_{CE2})}} \qquad (7)$$

Since a waveform distortion occurs in the vicinity of the frequency fr in which the trap occurs, there is a problem that there is a case where the cascode amplifier circuit must suppress the frequency band at the sacrifice of its feature.

The temperature characteristic of the gain of the variable gain amplifier circuit shown in FIG. 25A will now be considered. The gain is proportional to the division ratio of the signal current 98 flowing through the transistors 93 and 94 constituting the differential pair, that is, a ratio $i_{e1}/i_{e2}$ of emitter currents 290 and 291 and can be expressed as shown by the following equation (8):

$$i_{e1}/i_{e2} \approx 1/\{1+\exp(q\Delta V_B/kT_j)\} \qquad (8)$$

where q is an amount of electron charges, k is the Bolzmann constant, and $T_j$ is a temperature of the junction of the transistors 93 and 94.

Accordingly, in order to obtain a fixed gain, it is necessary to vary a temperature coefficient $\partial\Delta V_B/\partial T_j$ for a voltage $\Delta V_B$ of a differential pair control voltage source 9 in accordance with $\Delta V_B$ as shown by the characteristic 293 of FIG. 25B. A variation amount of the junction temperature $T_j$ is equal to a variation amount of the ambient temperature of the transistors 93 and 94. Accordingly, if the voltage $\Delta V_B$ is constant regardless of the ambient temperature, the ratio $i_{e1}/i_{e2}$ of the divided currents is drifted toward 1 with the increase of the ambient temperature.

SUMMARY OF THE INVENTION

It is a first object of the present invention to provide an amplifier circuit having one operation state in which input and output voltages are maintained constant even if a gain is varied. Accordingly, by applying the amplifier circuit of the present invention to a video amplifier circuit, the cut-off adjustment which has already been set is not shifted even if the drive adjustment is made.

It is a second object of the present invention to eliminate or suppress a trap occurring in an input frequency characteristic of a cascode amplifier circuit.

It is a third object of the present invention to provide a control circuit suitable for control of a variable gain amplifier circuit and having a temperature coefficient of a control voltage varying in accordance with the control voltage.

In order to achieve the first object, in the amplifier circuit according to the present invention, a voltage source for fixing of an operation point is connected in series to a variable impedance concerning setting of a gain of the amplifier, and no current flows through the variable impedance in an input signal level at which an operation point is fixed. Accordingly, even if a value of the variable impedance is varied, the operation point of the amplifier circuit remains fixed.

In order to achieve the second object, in the cascade amplifier circuit according to the present invention, a ground terminal of an amplification element of a succeeding stage is connected to a signal reference point through an impedance for compensation of a frequency characteristic with regard to the alternating current.

The frequency characteristic compensation impedance serves to convert an input impedance of the amplification element of the succeeding stage into a noninductive impedance within a necessary frequency band. Accordingly, in the input terminal of the cascade amplifier circuit of the present invention, deterioration of the frequency characteristic as described above can be eliminated.

Further, in order to achieve the third object, the control circuit of the present invention varies an output voltage and a temperature coefficient of the output voltage simultaneously to reduce a temperature drift of the variable gain amplifier circuit to be controlled to zero. Accordingly, the temperature stability of the gain of the variable gain amplifier circuit is improved. The present invention can attain the following advantages.

(1) According to the present invention, there can be provided the amplifier circuit having one operation state in which the input and output voltages are maintained constant even if the gain is varied. Accordingly, by applying the present invention to the video amplifier circuit, the adjustment time of the white balance can be reduced greatly and the adjustment accuracy can be improved.

(2) According to the present invention, the trap occurring in the frequency characteristic at the input of the cascade amplifier circuit can be eliminated or suppressed. Accordingly, by using the present invention, the wideband characteristic of the cascade amplifier circuit can be utilized sufficiently.

(3) According to the present invention, even if the control voltage having the temperature coefficient with voltage dependency is required to control the gain of the variable gain amplifier circuit, this control voltage can be supplied. Accordingly, by applying the present invention to the control circuit of the variable gain amplifier circuit, the temperature stability of the variable gain amplifier circuit can be improved.

DESCRIPTION OF THE PREFERRED EMBODIMENTS

Figure 1:
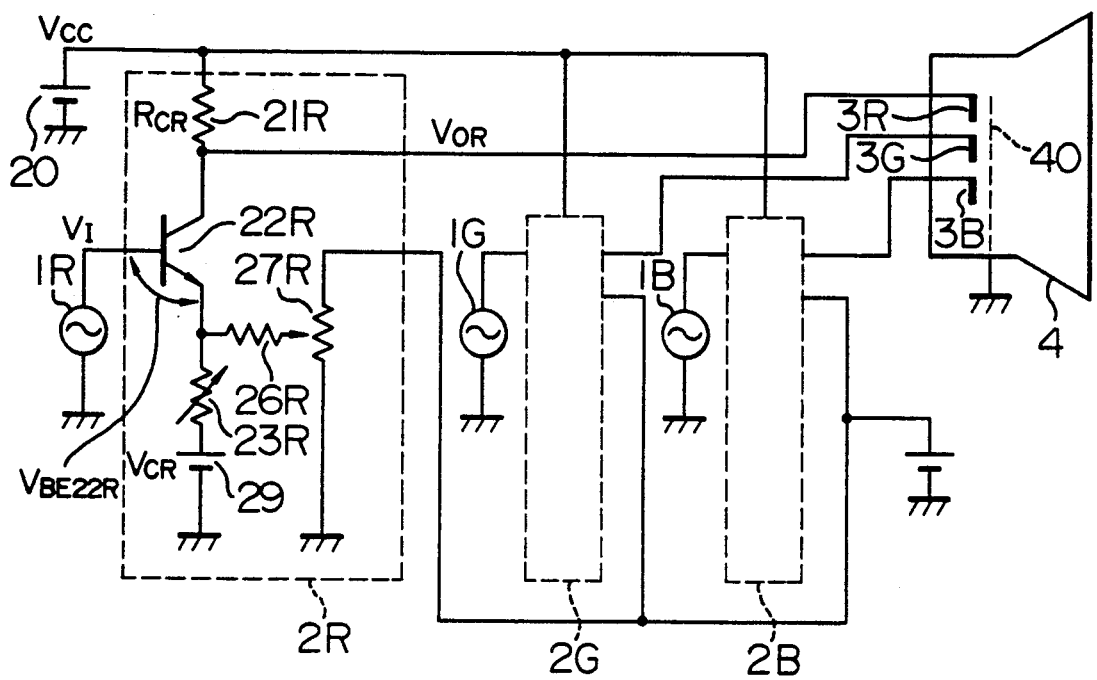
FIG. 1 is a circuit diagram showing a first embodiment of the present invention.
Figure 2:
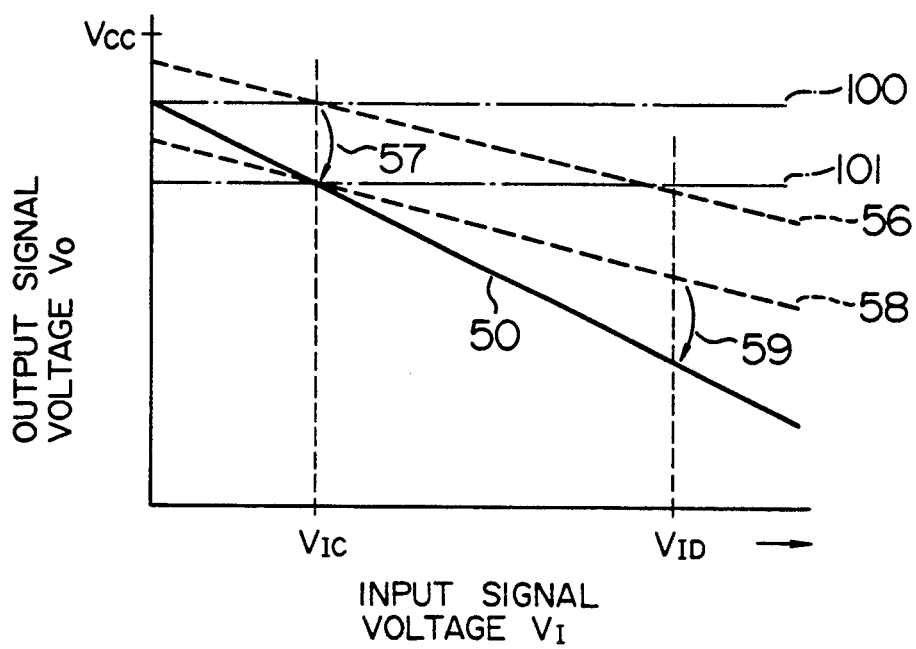
FIG. 2 is a characteristic diagram showing an input and output characteristic in the embodiment shown in FIG. 1.
Figure 3:
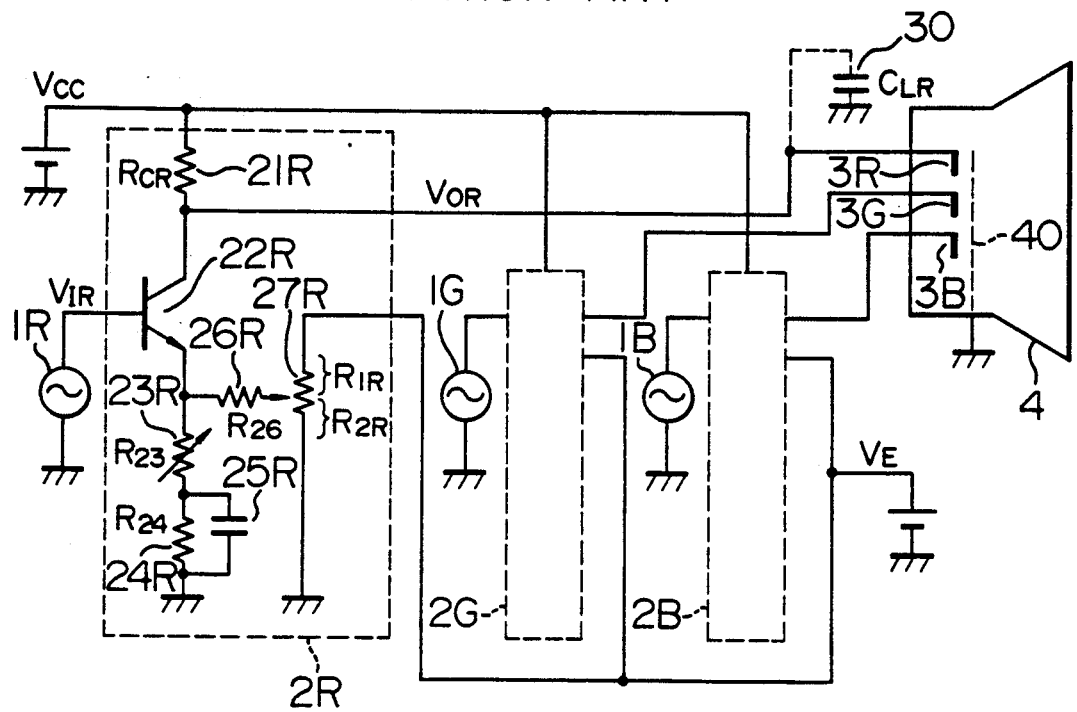
FIG. 3 is a circuit diagram showing a conventional video amplifier circuit.

A first embodiment according to the present invention is now described with reference to FIG. 1. Description is made to an R color circuit as a representative of a three-primary color circuit. The flow of signals in FIG. 1 is the same as that of FIG. 3 showing the prior art. In FIG. 1, however, an operation point fixing power source 29 is connected in series to the variable resistor 23R for the drive adjustment in the video amplifier circuit 2R. The connection of the power source 29 can ensure a fixed operation point regardless of a resistance value of the variable resistor 23R for the drive adjustment. However, it is necessary that a voltage $V_{CR}$ of the power source 29 is set to be substantially equal to an emitter voltage ($V_{IC} - V_{BE22R}$) of the transistor 22R in the cut-off adjustment. The voltage $V_{IC}$ is an input voltage at the cut-off adjustment point of FIG. 2. By setting the voltage $V_{CR}$ as described above, a current flowing from the emitter of the transistor 22R to the variable resistor 23R in the cut-off adjustment can be made small enough to be considered negligible and the circuit operation point at this time can be adjusted independently of the resistance value of the variable resistor 23R.

Figure 4:
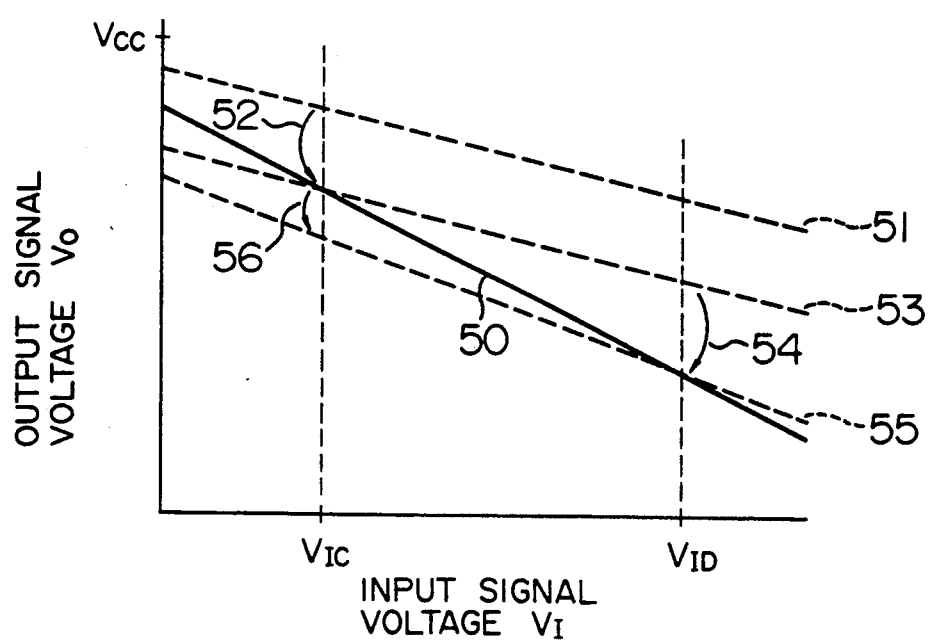
FIG. 4 is a characteristic diagram showing an input and output characteristic in the conventional circuit shown in FIG. 3.

The white balance adjustment process in the embodiment shown in FIG. 1 is now described with reference to an input and output characteristic diagram of the video amplifier circuit shown in FIG. 2. In the characteristic diagram of FIG. 2, the abscissa represents an input signal voltage $V_I$, the ordinate represents an output signal voltage $V_O$, and a straight solid line 50 represents an input and output characteristic to be targeted, similarly to the characteristic diagram of FIG. 4. It is assumed that the initial state of the video amplifier circuit is a state shown by a broken line 56. When the first cut-off adjustment is made, the input and output characteristic in the initial state shown by the broken line 56 is shifted as shown by an arrow 57 to move to the characteristic shown by a broken line 58. Even if the voltage gain adjustment shown by an arrow 59 is made in the next drive adjustment, since the output operation point in the cut-off adjustment set already is maintained constant, the input and output characteristic which nearly satisfies the target can be attained without repeated adjustment.

In an actual circuit, however, an error caused by manufacturing tolerances in products or the like occurs between the voltage $V_{CR}$ of the voltage source 29 and the emitter voltage ($V_{IC} - V_{BE22R}$) of the transistor 22R in the cut-off adjustment. When this error is increased to a certain extent or more, the independence of the drive adjustment at the output operation point in the cut-off adjustment is lost and when the adjustment as before is to be made, the repeated adjustments are required though the number of times for the repetition is small. Even in such a case, a method of completing the white balance in a single operation is now described. First of all, the variable resistor 23R for the drive adjustment shown in FIG. 1 is set to a maximum resistance value (if possible, open) before the cut-off adjustment. At this time, the input and output characteristic of the video amplifier circuit 2R at its initial state possesses a voltage gain suppressed as shown by one-dot chain line 100 of FIG. 2. Accordingly, even if a small error is contained in the input voltage $V_I$, a fixed output signal voltage $V_O$, set in the cut-off adjustment is ensured. Thus, since the current flowing to the transistor 22R through the variable resistor 23R for the drive adjustment can be reduced even if there is a small error between the voltages, the cut-off adjustment can be implemented easily without influence of the drive adjustment. In the cut-off adjustment, the level shift is made in the direction shown by an arrow 57 of FIG. 2 to move to the characteristic shown by one-dot chain line 101. Finally, the input and output characteristic 50 to be targeted is set by the drive adjustment. The adjustment time can be shortened greatly as compared with the prior art by using the white balance adjustment method as described above.

Further, the capability of fixing the operation point of the circuit even in the voltage gain adjustment described above is attainably also by changing a different gain setting impedance in the amplifier circuit, for example, an output resistor 21R in the R color circuit of FIG. 1 into a variable resistor and connecting a voltage source for fixing the operation point in series between the variable resistor and the positive electrode of a power supply 20.

Figure 5:
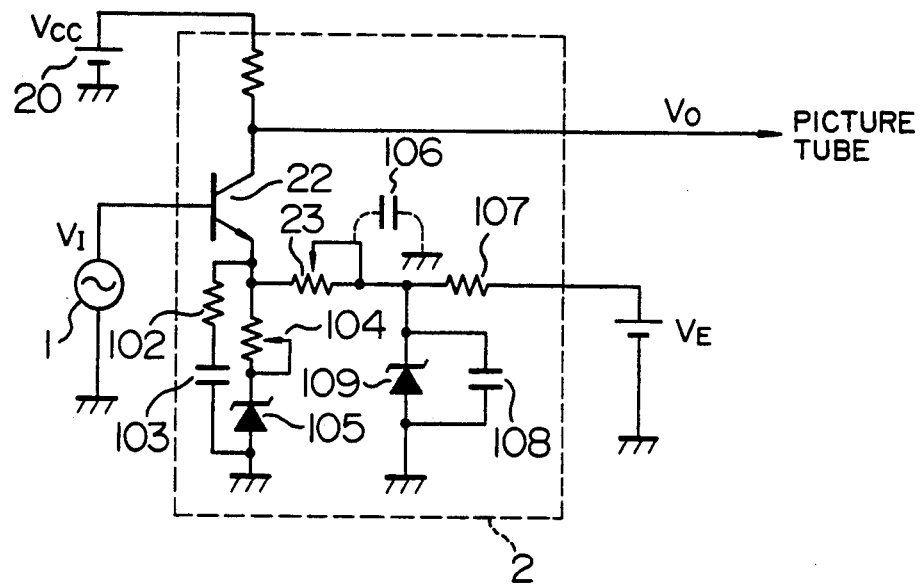
FIG. 5 is a circuit diagram showing a second embodiment of the present invention.

FIG. 5 shows another embodiment in which a zener diode is used to realize the operation point fixing power source. In FIG. 5, a zener diode 109 serves as the operation point fixing power source and a temperature coefficient of a zener voltage of the zener diode 109 corresponds to a temperature coefficient of the emitter potential of the transistor 22, so that the white balance adjustment accuracy can be further improved. A resistor 107 is a bias resistor of the zener diode 109. A capacitor 108 is a bypass capacitor for ensuring a low impedance of the power source constituted by the zener diode 109 even when a signal current flowing through the zener diode 109 is increased or even in a high frequency. In addition, since a parasitic capacitance and a stray capacitance exist in a sliding element of the variable resistor 23 for the drive adjustment, the sliding element must be connected to ground through the capacitor 108 with regard to the alternating current as shown in the figure so as to suppress unnecessary emitter peaking occurring in the transistor 22 through the parasitic capacitance and the stray capacitance to the utmost. The peaking is the phenomenon that a high-frequency current leaks through a stray capacitance or a parasitic capacitance when a frequency becomes high so that a gain is increased. Similarly, a sliding element of a variable resistor 104 for the cut-off adjustment is preferably connected to a zener diode 105 which is regarded as a ground point with regard to the alternating current. However, a current flowing through the variable resistor 104 is unidirectional and a current always flows to the sliding element. In general, when a current continuously flows into a variable resistor from its sliding element, the electrolytic corrosion phenomenon occurs to bring contact failure in the sliding element, so that a discontinuous point is produced in a variable range of the variable resistor to deteriorate the reliability of the variable resistor. Accordingly, when influence of the parasitic capacitance associated with the sliding element can be neglected or when the current flowing to the sliding element is large, it is necessary to re-connect the sliding element of the variable resistor 104 to the emitter electrode of the transistor 22 in FIG. 5. Further, the zener diode 105 serves to compensate for temperature drift of an emitter potential of the transistor 22 similarly to the zener diode 109. A resistor 102 and a capacitor 103 are emitter peaking elements for the transistor 22. Since the emitter peaking elements 102 and 103 are connected in parallel to the zener diode 105, a bypass capacitor corresponding to the capacitor 108 added to the zener diode 109 and connected directly between the cathode and the anode of the zener diode 105 is not required.

The advantage of using the zener diodes 105 and 109 is that a bypass current flowing through a voltage source element such as the zener diode can be suppressed to the requisite minimum by a low internal impedance of the voltage source element to attain the low power consumption of the circuit in addition to the ability of an exact setting of the temperature coefficient in the zener diode, as described above. Accordingly, it is a matter of course that the zener diodes 105 and 109 used in FIG. 5 can be replaced by other kind of diodes or a voltage source circuit constituted of active elements such as transistors.

Figure 6:
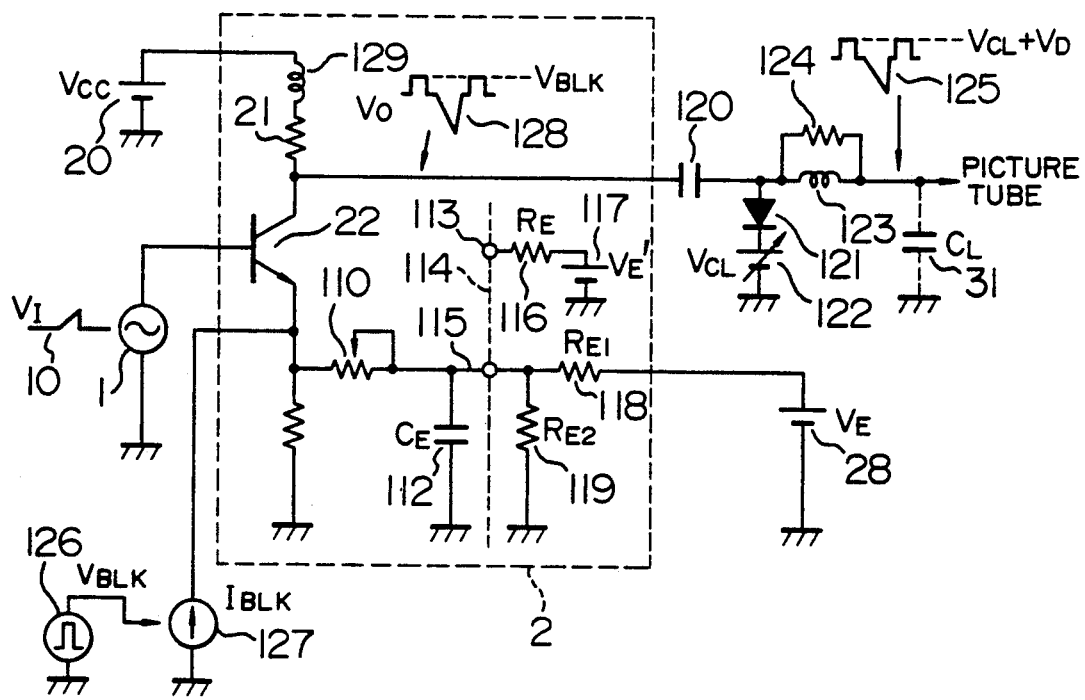
FIG. 6 is a circuit diagram showing a third embodiment of the present invention.

FIG. 6 shows an embodiment in which a voltage division circuit using resistors is used to realize the operation point fixing power source equivalently. In FIG. 6, an equivalent circuit on the side of voltage division resistors 118 and 119 as viewed from a broken line 114 is a series connection of an equivalent resistor 116 connected to a terminal 113 and an equivalent voltage source 117. A resistance value $R_E$ and a voltage value $V_E'$ thereof can be expressed by the following equations (9) and (10):

$$R_E = R_{E1} // R_{E2} = \frac{R_{E1} \cdot R_{E2}}{R_{E1} + R_{E2}} \quad (9)$$

$$V_E' = \frac{R_{E1} \cdot V_E}{R_{E1} + R_{E2}} \quad (10)$$

Accordingly, by setting the voltage value $V_E'$ of the equivalent voltage source 117 properly, the retention of the operation point which is an object of the present invention is possible. Further, as shown in FIG. 6, connection of a capacitor 112 between an input terminal 115 of the voltage division circuit using the resistors and the ground can add the emitter peaking caused by a frequency characteristic of a combined impedance of the capacitor 112 and the equivalent internal resistor 116 to the transistor 22.

In FIG. 6, a variable resistor 110 is used for the drive adjustment, and the cut-off adjustment is made by varying a variable voltage source 122 for a clamp. The principle of the cut-off adjustment in the circuit system shown in FIG. 6 will now be descried. An input signal $V_I$ supplied from a signal source 1 to the video amplifier circuit 2 and having a waveform 10 shown is invertedly amplified to be an output signal $V_o$ shown by a waveform 128. The output voltage $V_o$ is reproduced to a DC signal by means of a clamp circuit constituted of a coupling capacitor 120, a diode 121 and the variable voltage source 122 and is applied to a drive electrode of a picture tube. The transistor 22 is cut off during the blanking period by flowing a conversion current $I_{BLK}$ of a blanking pulse $V_{BLK}$ from a blanking signal source 126 to the emitter of the transistor 22 from a voltage-to-current converting circuit 127. Thus, the output signal $V_o$ of the video amplifier circuit 2 is a superposition of a blanking signal and a video signal having a peak value of the potential $V_{BLK}$ as shown by the waveform 128. Consequently, a peak value of a signal waveform 125 for driving the picture tube is set to $(V_{CL}+V_D)$ by a clamping operation by the peak value of the clamp circuit. $V_{CL}$ is a voltage value of the variable voltage source 122 used for the cut-off adjustment and $V_D$ is a forward voltage of the diode 121. Since an amplitude of the blanking signal is constant, the operation point of the output voltage applied to the picture tube can be maintained even in the embodiment shown in FIG. 6 without interference of the drive adjustment. Further, since it is not necessary to amplify the DC component of the drive voltage of the picture tube by the video amplifier circuit 2 and since the DC drift occurring in the drive voltage of the picture tube can be suppressed by the effect of the clamp circuit, the voltage $V_{CC}$ of the power source 20 can be lowered to reduce a power consumption of the circuit. With the above low power consumption, the circuit shown in FIG. 6 can be applied to a wide-band large output video amplifier circuit used in a superhigh definition display or the like. Coils 129 and 123 and a damping resistor 124 shown in FIG. 6 are series-parallel peaking elements required to suppress the influence of the load capacitance 31 to attain a wide band.

Another feature of the circuit shown in FIG. 6 is that the frequency characteristic of the emitter peaking operating on the transistor 22 is not varied even if the cut-off adjustment is made. In the conventional circuit shown in FIG. 3 or the embodiment shown in FIG. 5, by changing the setting of a resistance value of the variable resistor 27R or 104 for the cut-off adjustment, the time constant between a capacitance value of the emitter peaking capacitor and the resistor is also varied. However, in the embodiment shown in FIG. 6, the time constant between the emitter peaking capacitor 112 and the resistor connected to the vicinity of the emitter peaking capacitor is maintained constant in the cut-off adjustment. This means that the frequency characteristic of the video amplifier circuit 2 is stable even in the cut-off adjustment.

Figure 7:
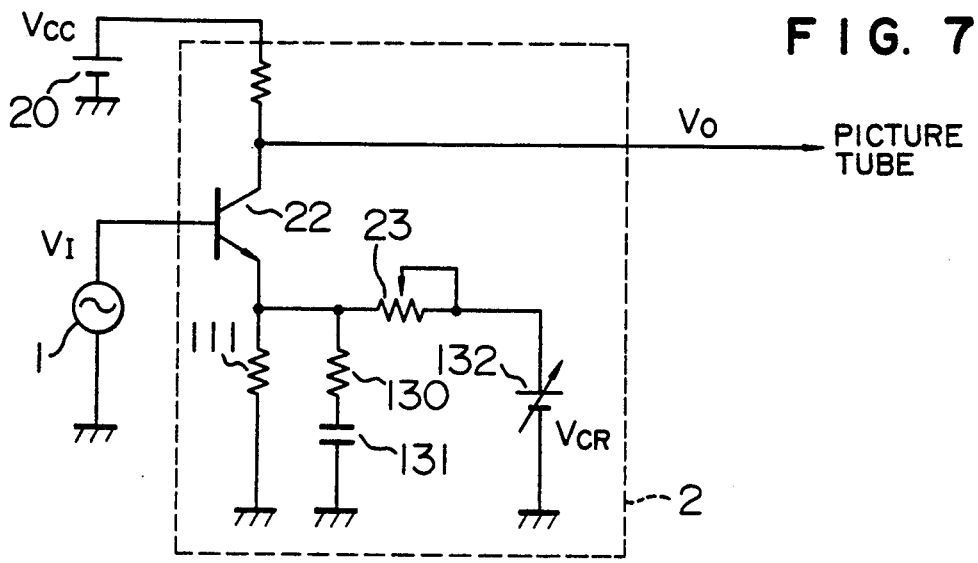
FIG. 7 is a circuit diagram showing a fourth embodiment of the present invention.

FIG. 7 shows still another embodiment having a feature that the frequency characteristic is not varied even in the cut-off adjustment in addition to the feature that the output operation point in the drive adjustment is fixed. In the circuit shown in FIG. 7, the cut-off adjustment is made by varying a voltage $V_{CR}$ of a voltage source 132 connected in series to a variable resistor for the drive adjustment. Accordingly, even in the cut-off adjustment, since the time constant determined by a peaking capacitor 131 and resistors 130, 111 and 23 is maintained constant, the frequency characteristic of the video amplifier circuit 2 is also stabilized. Further, even in the drive adjustment, the operation point in which an emitter voltage of the transistor 22 is equal to the voltage $V_{CR}$ of the variable voltage source 132 is fixed.

Figure 8A:
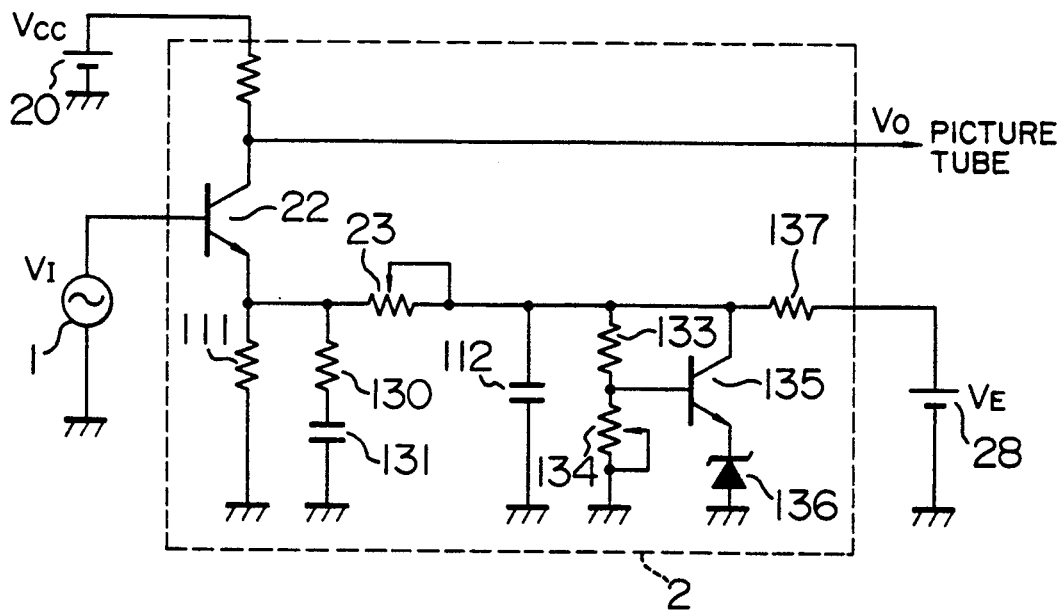
FIGS. 8A and 8B are circuit diagrams showing a fifth embodiment of the present invention.
Figure 8B:
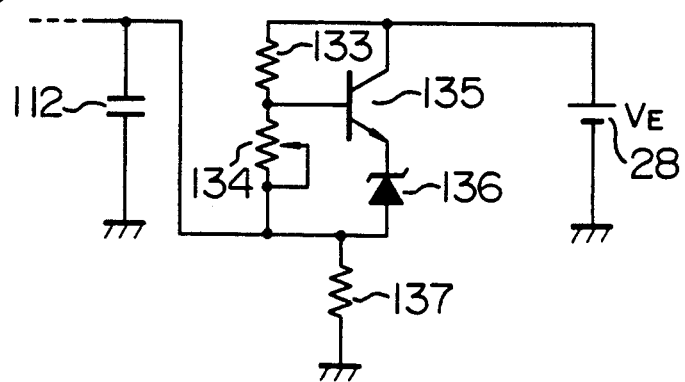

An embodiment in which the variable voltage source 132 shown in FIG. 7 is constituted by a voltage source circuit using a transistor is shown in FIG. 8A. In FIG. 8A, the voltage source circuit is constituted of a transistor 135 and resistors 133 and 134. A negative feedback is effected to the transistor 135 through a voltage division circuit composed of the resistor 133 and the variable resistor 134, so that a collector voltage of the transistor 135 is maintained constant. A resistance value of the variable resistor 134 is adjusted in the cut-off adjustment. Since a zener diode 136 is used to set a base potential of the transistor 135 and a temperature coefficient thereof, the zener diode may be removed (short-circuited) if the requisite accuracy can be ensured. A resistor 137 is a bias resistor for flowing a bias current to the transistor 135. The resistor 137 may be connected as shown in FIG. 8B. In this case, an effect capable of producing a voltage having the temperature coefficient with an inverted sign to that of the temperature coefficient of the voltage of the voltage source circuit obtained from the configuration shown in FIG. 8A is obtained. In addition, a capacitor 112 is a bypass capacitor used to reduce an internal impedance of the voltage source circuit.

Figure 9:
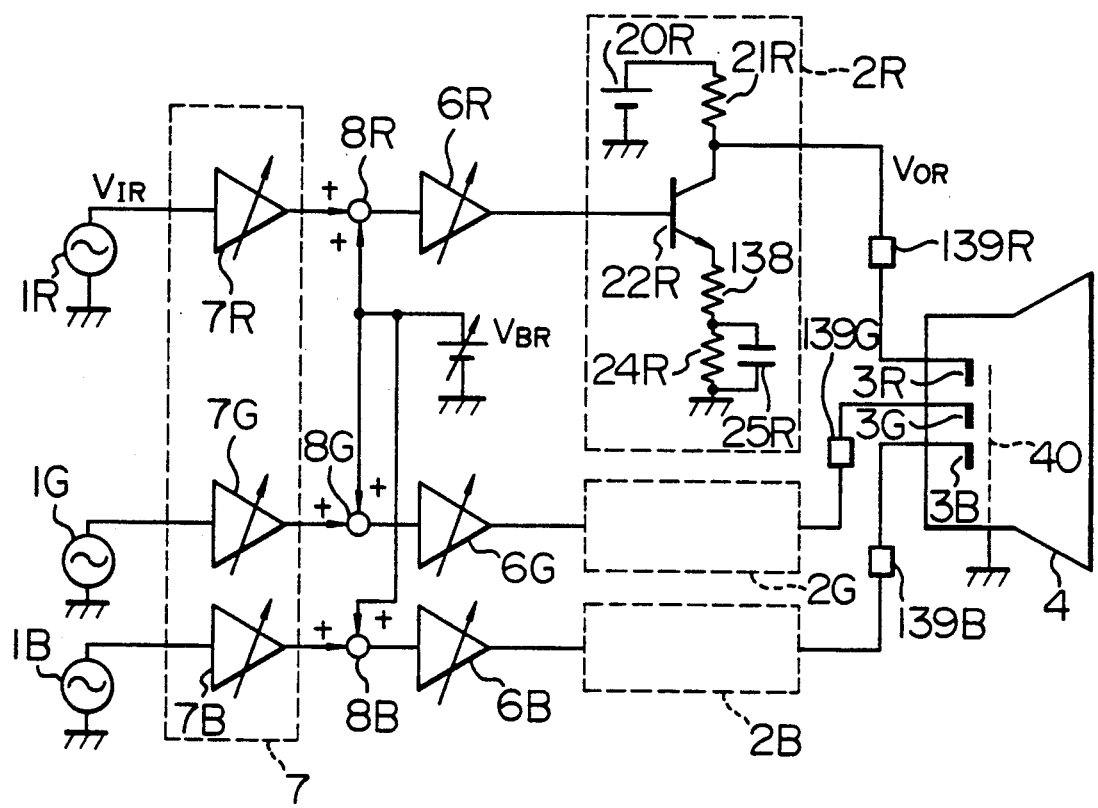
FIG. 9 is a block diagram showing a whole video signal circuit to which the embodiment of the present invention can be applied.

However, in the embodiments of the present invention described above, the emitter peaking characteristic of the video amplifier circuit is varied slightly in at least one of the cut-off adjustment and the drive adjustment. When the peaking characteristic is varied, the frequency characteristic of the video amplifier circuit is varied. Thus, description is made to an embodiment in which the frequency characteristic of the video amplifier circuit can be maintained stably even in the adjustment. FIG. 9 is a block diagram showing the whole configuration of the video amplifier circuit having the stable frequency characteristic. In FIG. 9, input video signals for the three primary colors are subjected to gain control with a common ratio in the three primary colors in contrast control circuits 7R, 7G and 7B. A brightness signal component $V_{BR}$ having the same level in the three primary colors is added to each of the video signals for the primary colors in adders 8R, 8G and 8B. The contrast control circuit required to have the high-accuracy tracking performance among the three primary color circuits is often integrated on a single chip. Then, the video signal is supplied through drive control circuit 6R, 6G and 6B capable of controlling the gain independently among the three primary colors and video amplifier circuit 2R, 2G and 2B to clamp circuits 139R, 139G and 139B for the cut-off adjustment. The video signals for the primary colors are reproduced to DC signals having a necessary level by the clamp circuits 139R, 139G and 139B for the cut-off adjustment and are then applied to the cathode electrodes 3R, 3G and 3B of the picture tube 4. The frequency characteristic of the whole video signal circuit is influenced strongly by the frequency characteristic of the video amplifier circuits 2R, 2G and 2B having the narrowest frequency characteristics in general. Thus, in the R color circuit, for example, the white balance is adjusted while peaking elements 24R, 25R and 138 determining the emitter peaking operation of the video amplifier circuit 2R are fixed to predetermined element values, so that a predetermined peaking characteristic is ensured. The same operation is also made to other primary color circuits. Accordingly, by using the video signal circuit shown in FIG. 9, the stable frequency characteristic can be maintained even in the adjustment of the white balance.

Figure 10:
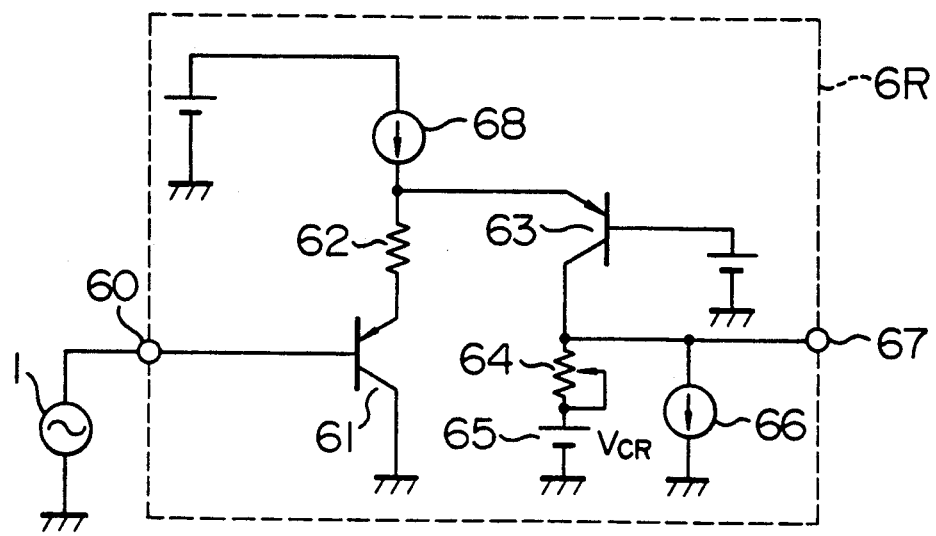
FIG. 10 is a circuit diagram showing a sixth embodiment of the present invention.

An embodiment of the variable gain amplifier circuits 6R, 6G and 6B of the present invention applied to the drive control circuit of FIG. 9 is shown in FIG. 10. The circuit 6R is described as a representative. A signal voltage of a signal source 1 connected to an input terminal 60 of the variable gain amplifier circuit 6R shown in FIG. 10 is applied through an emitter follower transistor 61 to a gain setting impedance 62 to be converted into a current. This signal current flows through a grounded-base transistor 63 to a gain setting variable impedance 64, so that an amplified signal voltage is obtained to be produced at an output terminal 67 of the circuit. The circuit shown in FIG. 10 possesses a feature that the potentials of the input and output signals are substantially equal. In FIG. 10, a voltage source 65 connected to the impedance 64 serves as the operation point fixing voltage source and can produce an output voltage until the voltage is negative by operation of a current source 66 to be described. Accordingly, the voltage of the voltage source 65 can be set to any value within a range in which the transistor 63 is not saturated or broken. Thus, the voltage source 65 can be short-circuited to remove it or can be replaced by a constant voltage element such as a zener diode. Further, when a current value of the current source 66 is substantially equal to a collector current value of the transistor 63, the output voltage of the output terminal 67 is equal to a voltage $V_{CR}$ of the voltage source 65 and the operation point fixed independently of the impedance of the variable impedance 64 is obtained. In addition, by connecting the current source 66 in parallel to the series connection of the gain setting impedance 64 and the voltage source 65, if the transistor 63 is within the unsaturated range, the signal current can flow to the variable impedance 64 over the whole dynamic range. Thus, the dynamic range of the output signal can be expanded. Since the transistors 61 and 63 constitute a differential circuit in FIG. 10, the signal voltage may be supplied to any base of the transistor 61 and 63. The current source 68 serves to flow the converted signal current to the emitter of the transistor 63 efficiently and can be replaced by a resistor.

Figure 11:
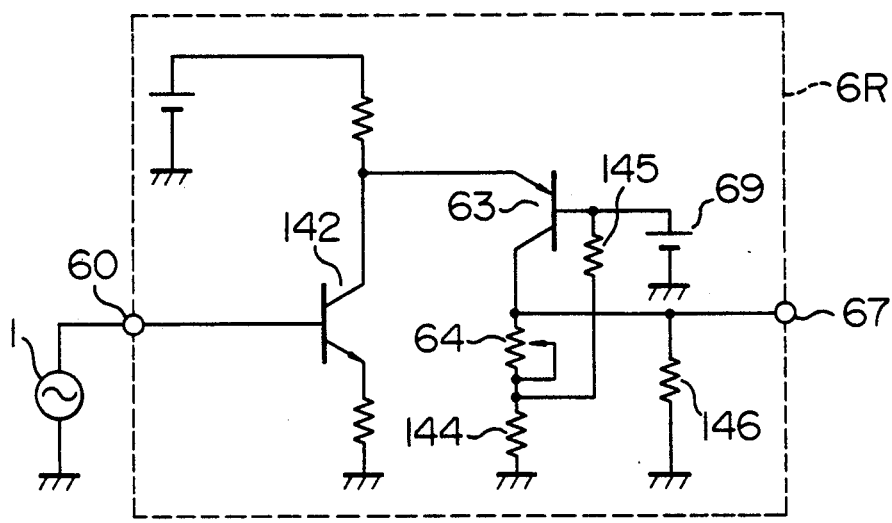
FIG. 11 is a circuit diagram showing a seventh embodiment of the present invention.

A still further embodiment of the variable gain amplifier circuit of the present invention is now shown in FIG. 11. In FIG. 11, the operation fixing voltage source 65 of FIG. 10 is replaced by an equivalent voltage source of a voltage division circuit constituted of resistors 145 and 144 and a voltage source 69, and the dynamic range expanding current source 66 of FIG. 10 is replaced by a resistor 146. Even if the resistor 146 is used, the operation point in which the output voltage is equal to the voltage of the equivalent voltage source is fixed independently of the gain control. Further, since a signal input transistor 142 is configured in the grounded-emitter type, its collector voltage can be set to any voltage within a range in which the transistor 142 is not saturated, so that the degree of freedom for the circuit design is large. Further, when a desired temperature characteristic is given to the output voltage, it is possible to connect an element such as a diode having a temperature dependence in series to the resistor 145, 144 or 146.

Figure 12A:
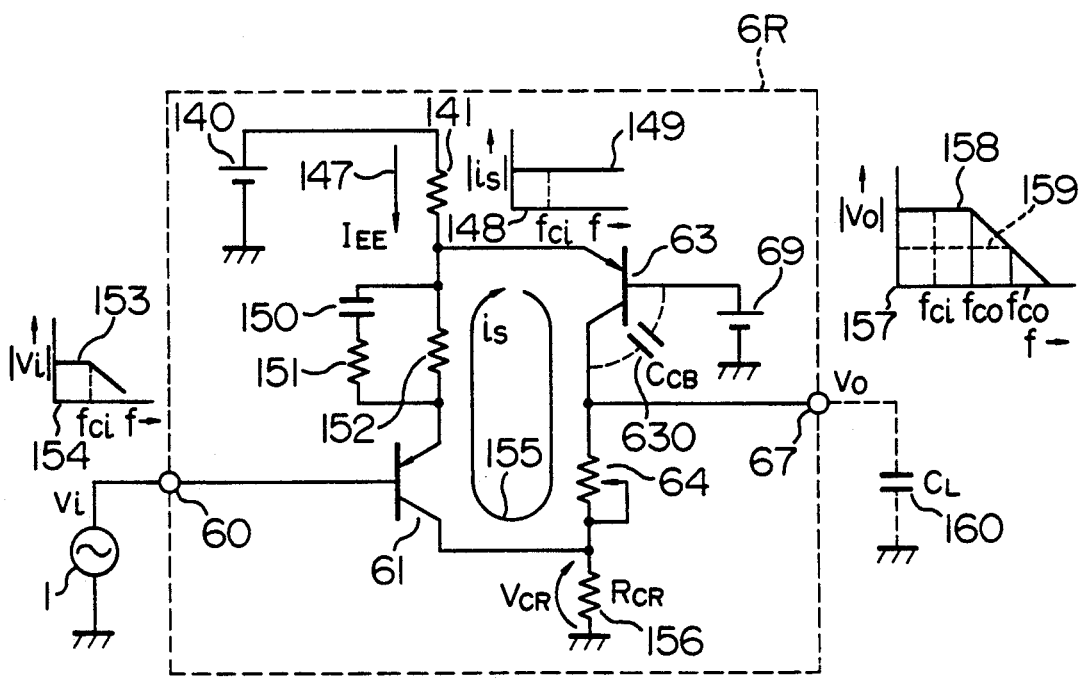
FIGS. 12A and 12B are circuit diagrams showing eighth embodiments of the present invention.

A still further embodiment of the variable gain amplifier circuit of the present invention is shown in FIG. 12A. In FIG. 12A, a resistor 156 realizes the operation point fixing voltage source 65. In the circuit of FIG. 12A, by connecting the collector of a transistor 61 to the resistor 156, a signal current 155 flowing between transistors 61 and 63 does not flow to the resistor 156. Accordingly, a voltage $V_{CR}$ across the resistor 156 is a fixed value equal to a product of a value $I_{EE}$ of a Current 147 flowing through a resistor 141 and a resistance value $R_{CR}$ of a resistor 156 and hence the resistor 156 is regarded as a voltage source having an internal resistance equal to the resistance value thereof equivalently. Further, the frequency band of the input signal can be expanded by using the embodiment of FIG. 12A and the principle thereof will now be described. When the frequency characteristic of a signal $V_i$ inputted from the signal source 1 is limited to a frequency band $f_{ci}$ as shown by a solid line 153 of the characteristic diagram 154, it is so designed that the frequency band $f_{ci}$ can compensate for values of emitter peaking elements 150 and 151. Consequently, the frequency characteristic of the signal current 155 is broadened as shown by a straight line 149 of the characteristic diagram 148. The frequency characteristic of an output signal $V_o$ is suppressed by a time constant determined by a product of a series resistance value of a variable impedance 64 and the resistor 156 and a parallel capacitance of a capacitance between the base and the collector of the transistor 63 and a load capacitance 160. Accordingly, as shown in the frequency characteristic diagram 157, a characteristic 158 (band $_{co}$) is attained in the maximum gain and a characteristic shown by one-dot broken line 159 (band $f_{co}'$) is attained in the limited gain, so that the frequency band can be expanded.

Figure 12B:
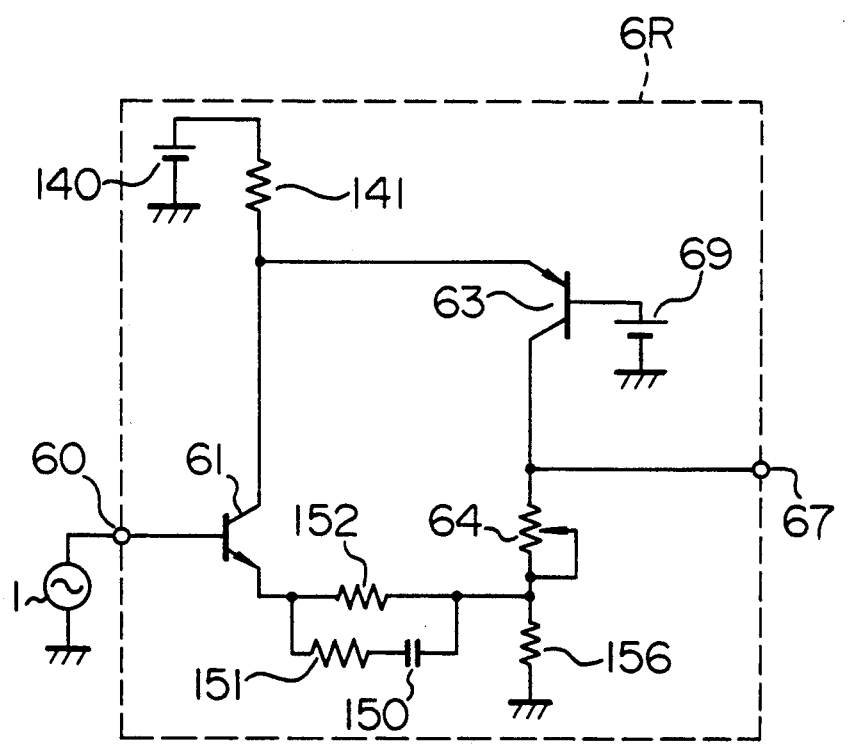

In FIG. 12A, the transistor 61 is used as a grounded-collector circuit, while it may be a grounded-emitter circuit. In this case, as shown in FIG. 12B, the transistor 61 is replaced by an NPN type transistor and the emitter electrode thereof is connected through the resistors 152 and 151 and the capacitor 150 to a junction between the resistor 156 and the variable resistor 64. The collector electrode of the transistor 61 is connected to the emitter electrode of the transistor 63.

Figure 13:
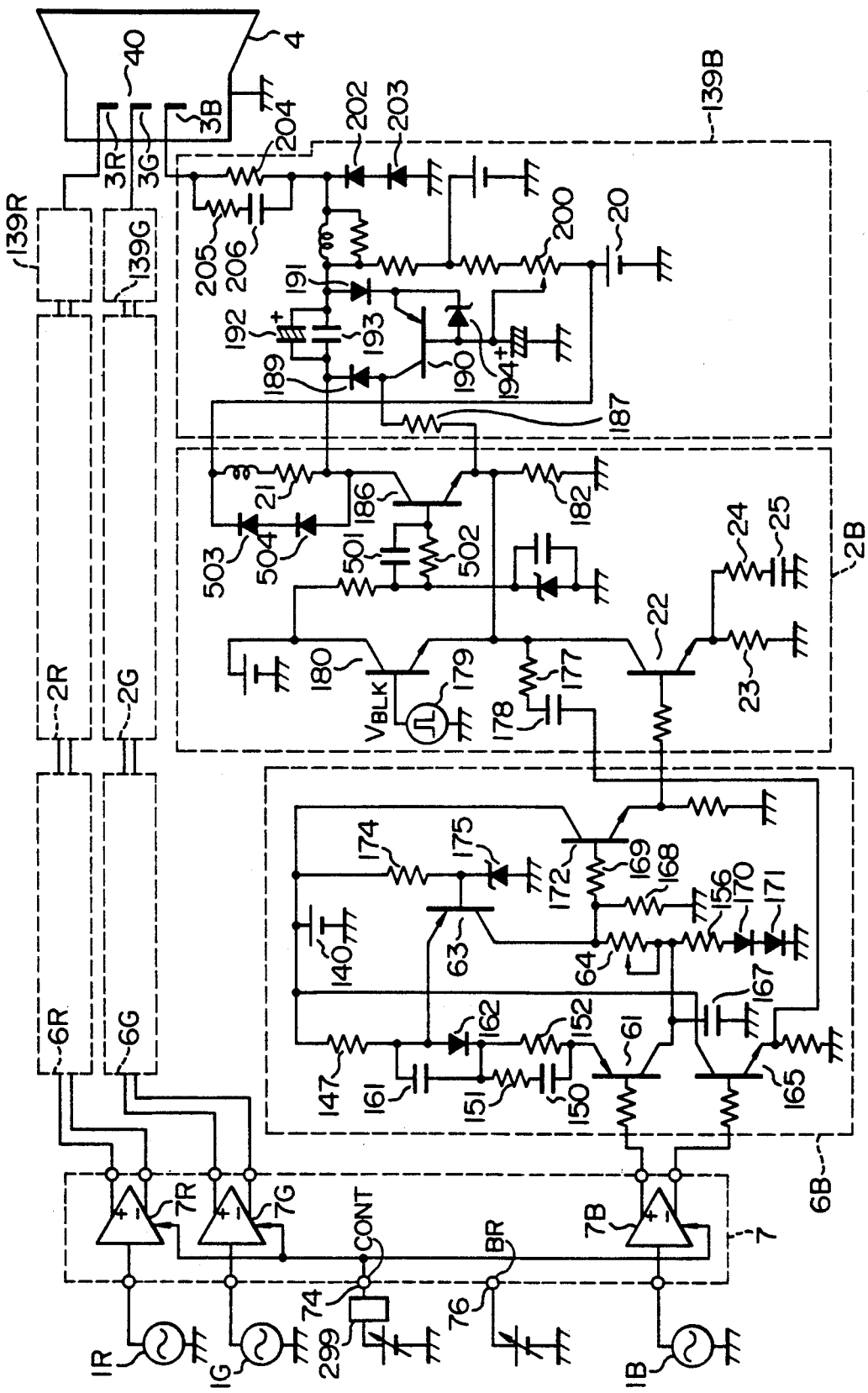
FIG. 13 is a circuit diagram showing a whole video signal circuit to which a ninth embodiment of the present invention is applied.
Figure 14:
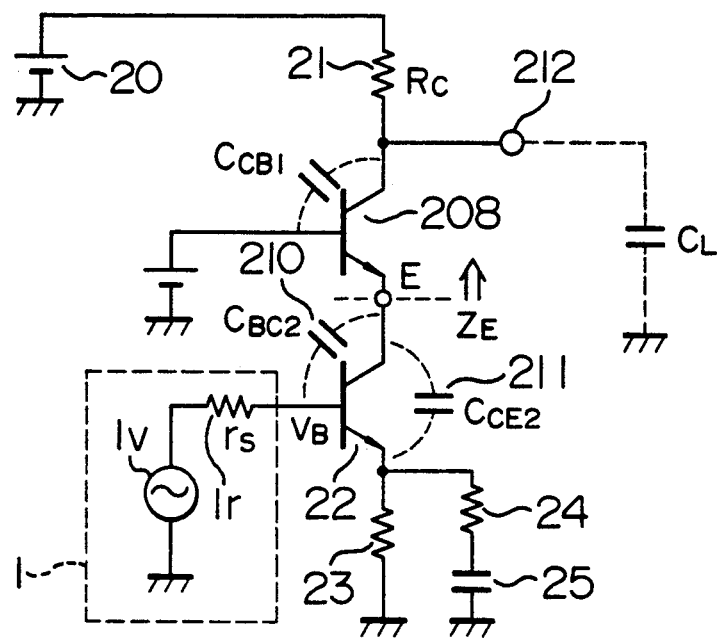
FIG. 14 is a circuit diagram showing a conventional cascode amplifier circuit.

The whole video signal circuit to which the embodiment of the present invention is applied is shown in FIG. 13. In FIG. 13, the primary color signals are subjected to contrast control and brightness control in a video processing circuit 7 and are then applied through drive control circuits 6R, 6G and 6B having the drive adjustable function and video amplifier circuits 2R, 2G and 2B having the cut-off adjustable function to cathodes 3R, 3G and 3B of the picture tube 4. The primary color circuits have the same configuration and accordingly operation of only the B color circuit is described along a signal path. A signal supplied from a signal source 1B is subjected to the contrast control (control terminal 74) and the brightness control (control terminal 76) in a video processing circuit 7B commonly to the three primary colors and is converted into a differential signal. A negative-phase signal obtained in the video processing circuit 7B is used to broaden a frequency band of the video amplifier circuit. A positive-phase primary signal is applied to the drive control circuit 6B and its amplitude is adjusted by a variable resistor 64 for the drive adjustment. In the drive control circuit 6B, the operation point fixing voltage source 65 of FIG. 10 is constituted of a resistor 156 and diodes 170 and 171, and a resistor 168 is used as the resistor 146 for expansion of the dynamic range of FIG. 11. A current component flowing in the collector of transistor 63 which is a current contributing to amplification of a positive-phase voltage, of the signal current corresponding to the current 155 of FIG. 12 leaks to the resistor 168 and part of a current component flowing in the collector of transistor 61 which is a current contributing to amplification of a negative-phase voltage flows through the resistor 156 for the voltage source, so that the gain is suppressed slightly. However, a capacitor 167 is added to bypass the negative-phase signal current in a high frequency, so that the gain in the high frequency is improved slightly and a kind of peaking effect is obtained. Further, a diode 162 has an effect of compensating for a temperature drift in addition to the operation of reducing a bias current flowing to the transistor 61 to reduce electric power of the circuit. A bypass capacitor 161 serves to suppress influence of the frequency dependence of an impedance of a diode 162. By selecting a proper zener diode 175 for supplying a base voltage to the transistor 63, the temperature dependence of a voltage between the base and the emitter of the transistor 63 can be compensated for to suppress a temperature drift of a bias current flowing through a bias resistor 147. Further, the diodes 170 and 171 serve to compensate for a temperature drift of a voltage between the base and the emitter of transistors connected to a succeeding stage of the diodes 170 and 171. Since a current having a certain value or more flows through the diodes 170 and 171 from the collectors of the transistors 61 and 63 complimentarily, it can be avoided that the bias current flowing through the diodes 170 and 171 is reduced remarkably within a signal dynamic range. Accordingly, the diodes 170 and 171 can operate as a stable voltage source. The drive controlled positive-phase signal and the negative-phase signal are supplied to the video amplifier circuit 2B through an emitter follower circuit composed of transistors 172 and 165. The video amplifier circuit 2B includes a cascade amplifier circuit composed of a grounded-emitter transistor 22 and a grounded-base transistor 186, a cut-off adjustment clamp circuit composed of a clamp transistor 190 and a blanking circuit using an emitter-coupled current switching circuit composed of a transistor 180 and the grounded-base transistor 186. The negative-phase signal voltage inputted from the drive control circuit 6B is converted into a current by a series impedance of a capacitor 178 and a resistor 177 and is added in phase in a grounded-base transistor 186 to a positive-phase signal current inverted by the transistor 22. Since a blanking pulse $V_{BLK}$ from a blanking signal source 179 is supplied to the base of the transistor 180 and all collector current of the grounded-emitter transistor 22 flows to the transistor 180, the grounded-base transistor 186 is cut off during the blanking period. In order to shorten the rising of the transistor 186 after completion of the blanking period and suppress Q of a resonance phenomenon of the transistor 186 which is a cause of the trap occurring in the frequency characteristic of the cascade amplifier circuit, a resistor 182 is added. Further, capacitor 501 and resistor 502 connected to the base of the transistor 186 constitute an impedance circuit for suppressing the occurrence of the trap. An embodiment for compensating for the input frequency characteristic of the cascade amplifier circuit will be described later. The clamp circuit having a transistor 190 prevents a discharge current from flowing, when capacitors 193 and 192 are clamped, to a collector resistor 21 to thereby produce a clamp error. The discharge current flowing during the clamping flows through a switching diode 191 for peak clamp operation to the transistor 190 and branches from the collector thereof into a diode 189 and a resistor 187 to thereby return to the capacitors 193 and 192. During a normal display period which is a non-clamp period, the diode 189 is off to prevent a collector parasitic capacitance of the transistor 190 from adding to a load of the video amplifier circuit. Further, during the clamp period, a voltage drop across the resistor 187 produced by flowing the discharge current is utilized to turn on the diode 189 so that most of the discharge current can be returned through the diode 189 to the condensers 193 and 192. Accordingly, even if the discharge current is increased, there is no fear that the transistor is cut off and the clamp accuracy is reduced. Reduction of the frequency band of the video amplifier circuit 2B due to an increased load capacitance is suppressed by the effect of the diode 189. A base voltage of the transistor 190 is controlled by a variable resistor 200 for the cut-off adjustment and the clamp level is adjusted. The zener diode 191 protects the transistor 190 and bypasses bi-directional leakage components of the primary color signal currents by means of a large parasitic capacitance thereof. This suppresses occurrence of a problem that a high-frequency component of the signal voltage is detected by the junction between the base and the emitter of the transistor 190 and the clamp voltage is varied. Further, a circuit composed of resistors 204 and 205 and a capacitor 206 connected in series to the output of the video amplifier circuit serves to protect the video amplifier circuit upon discharge of the picture tube 4. A discharge voltage having a low frequency component is cut off by the resistor 204 having a large resistance value and an output signal having a high frequency component is sent to the cathode 3B through the resistor 205 having a low resistance value and the capacitor 206. Similarly, diodes 503, 504, 202 and 203 serve to protect the video amplifier circuit upon discharge of the picture tube 4 and that diodes connected in series to each other increase an output capacitance of the video amplifier circuit. Base resistors connected in series to the bases of the transistors in FIG. 13 are stabilizing resistors for suppressing oscillation of the transistors. Base resistors of transistors in FIG. 14 et seq. have the same effect.

As described above, the voltage source is connected in series to the gain setting impedance of the amplifier circuit, so that the operation point of the output can be fixed. Accordingly, application of the present invention is not limited to the video signal circuit shown in the embodiments and the present invention can be applied to any electronic control system such as, for example, an automatic control system if it is a system in which the input and output tracking characteristics are adjusted in two points. Further, application of the present invention can reduce substantially the number of times adjustments are repeated for effecting white balance of the video circuit. Accordingly, by applying the present invention to a block of an automatic white balance adjustment system, the automatic adjustment time can be reduced remarkably and the adjustment accuracy can be improved.

It is needless to say that the transistors used in the embodiments are replaced by active elements such as FET's and vacuum tubes, while the gain setting impedances and the variable impedance can be also replaced by electronically controllable elements such as FET's.

Further, by forming the impedance elements such as resistors or active elements concerning one of at least the gain control and the operation point control used in the embodiment onto a single-chip integrated circuit, matching among elements can be ensured and control accuracy can be improved.

Figure 17:
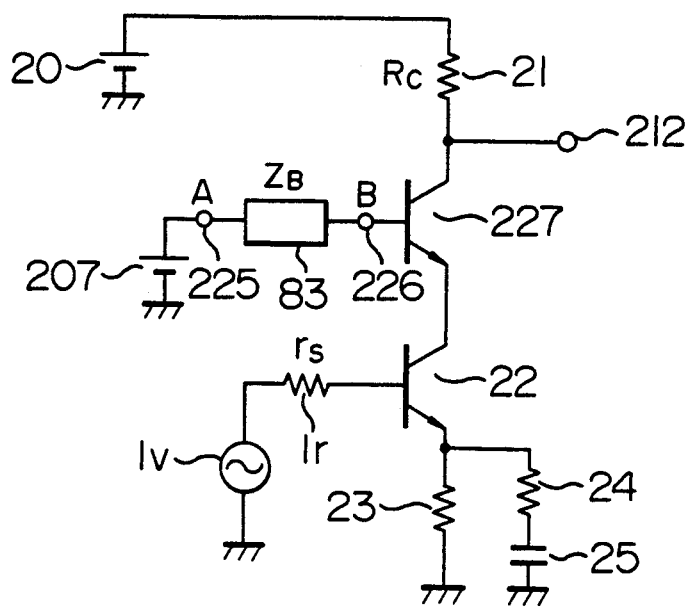
FIG. 17 is a circuit diagram showing a tenth embodiment of the present invention.

A first embodiment for achieving the second object of the present invention is shown in FIG. 17. In FIG. 17, in order to eliminate or suppress the trap occurring in the input frequency characteristic of the cascade amplifier circuit, the base of a grounded-base transistor is connected through a frequency characteristic compensation impedance formed between terminals 225 and 226 to a base bias voltage source 207. With such a configuration, the resonance by an inductive impedance component of an impedance as viewed from the emitter thereof is suppressed. The voltage source 207 may be a circuit giving an AC ground potential by a capacitor or a constant voltage. A condition necessary for a value $Z_B$ of the frequency characteristic compensation impedance 83 is considered. The following is considered from an input impedance $Z_E$ in the case where the base spread resistance $r_{bb}'$ in the equation (5) which analyzes the input impedance $Z_E$ of the grounded-base transistor 227 is replaced by $(Z_B + r_{bb}')$:

(1) On condition of the signal frequency $f_s >> 1/\{2\pi(c\pi r\pi 30\ c\mu.\ R_c)\}$, a complex vector of a base side impedance $(Z_B + r_{bb}')$ of the transistor 227 is advanced in phase by $+90°$ and appears as having a magnitude of $1/\beta_0$ at the impedance $Z_E$ of the transistor 227.

Figure 15:
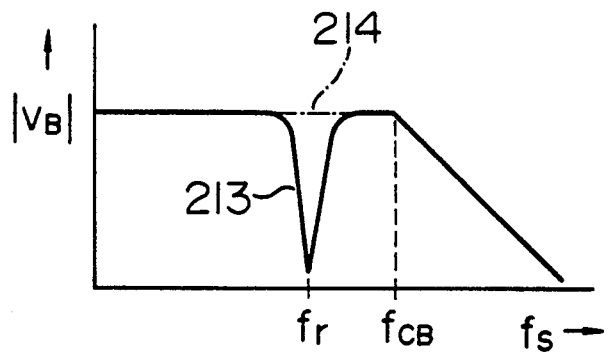
FIG. 15 is a characteristic diagram showing a frequency characteristic at an input of the conventional circuit shown in FIG. 14.
Figure 16:
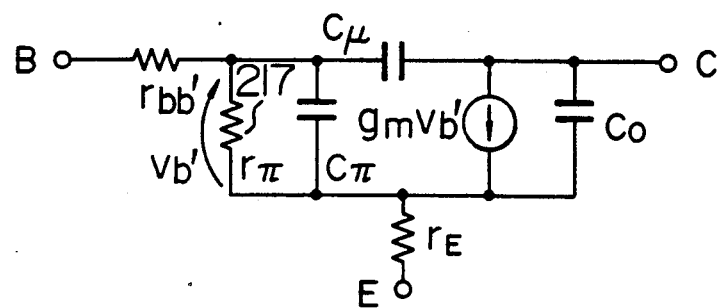
FIG. 16 is a circuit diagram showing an equivalent circuit of a transistor used for analysis.

(2) Accordingly, in the frequency band in which there is a possibility that the trap occurs, by setting the base side impedance $(Z_B + r_{bb}')$ of the transistor not to be resistive, the object of the present invention is achieved. Accordingly, the input frequency characteristic is improved as shown by one-dot broken line 214 of FIG. 15.

(3) In the equation (5), even when the operation resistance $r_x$ between the base and the emitter is made infinite, the condition of the signal frequency $f_s$ is varied, while the above considerations (1) and (2) are effected. Accordingly, even if the transistor 227 of FIG. 17 is replaced by an FET or a vacuum tube, the embodiment of the present invention can be applied.

Figure 18A:
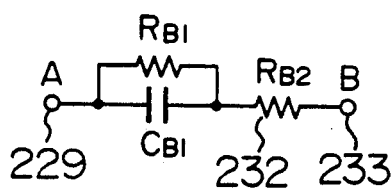
FIGS. 18A to 18F are circuit diagrams showing eleventh to sixteenth embodiments of the present invention together.
Figure 18B:
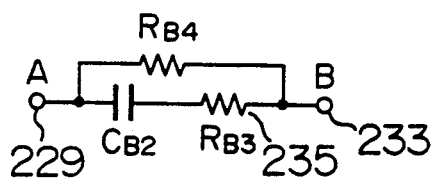

A configuration example of the frequency characteristic compensation impedance 83 of FIG. 17 is shown in FIGS. 18A to 18F as embodiments of the present invention. FIGS. 18A and 18B show embodiments exhibiting a capacitive impedance within a certain frequency range. Even if a value $R_{B2}$ of a resistor 232 in FIG. 18A and a value $R_{B3}$ of a resistor 235 in FIG. 18B are both set to zero, both of the circuits can attain the capacitive impedance.

Figure 18C:
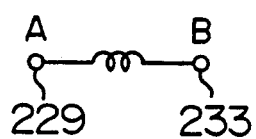

In addition, the frequency characteristic compensation impedance 83 may be an impedance including a coil as shown in FIG. 18C. In this case, an impedance formed by a parasitic capacitance which is dominant in a frequency area higher than a self-resonant frequency of the coil is obtained. Further, a capacitor may be added in parallel to the coil to set the resonant frequency by the coil to a desired frequency.

Figure 18D:
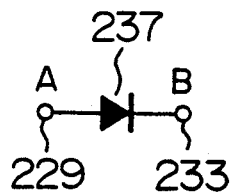
Figure 18E:
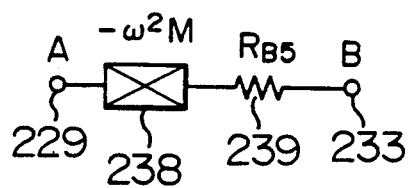
Figure 18F:
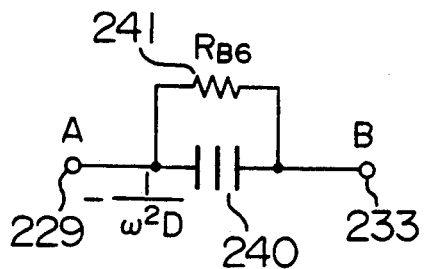

FIG. 18D shows an embodiment in which the frequency characteristic compensation impedance 83 is realized by a diode 237 which is connected so that the base current of the transistor of FIG. 17 is a forward current. In general, since a linear equivalent circuit of a diode is a parallel circuit of a resistor and a capacitor, the diode 237 may be any kind of diodes made of Si, Ge or GaAs. When the trap frequency fr is high, the diode 237 may be replaced by a high-speed element such as a Schottky barrier diode, and when the trap frequency fr is low, a capacitance is added in parallel to the diode 237 or the diode 237 may be replaced by a zener diode having a large parallel capacitance. If a temperature characteristic of the diode 237 has a bad influence, a parallel resistor can be added to the diode 237. In this case, however, even when the rising of the base power source 207 of the grounded-base transistor 227 of FIG. 7 is delayed upon turning on of the power source for the circuit, it is necessary to take care not to destroy the transistor 227. It is needless to say that the diode 237 can be replaced by a diode connection of a transistor having the same performance as the transistor 227 of FIG. 17. There is a case that the direction of the base current of the transistor 227 shown in FIG. 17 is reversed when the signal has a high frequency and a large amplitude, while a time constant of the diode 237 is relatively large in general and accordingly it is rare that the diode 237 is cut off. Even if the diode is cut off, it is unlikely that it would have a significant adverse effect when the transistor 227 is driven by a current. FIG. 18E shows an embodiment of the frequency characteristic compensation impedance 83 using a frequency dependent negative resistance (FDNR) 238. The FDNR has a negative impedance in the form of the second degree of $\omega$, that is, $-\omega \times \omega \times M$. As shown in FIG. 17, when the emitter peaking is effected by means of the capacitor 25 and the resistor 24, the phase of the signal current flowing through the transistor 22 advances within a range of $+90°$ or less in the frequency in which the gain is increased by the peaking. The advanced signal current flows to the emitter of the transistor 227, so that a signal voltage component corresponding to the case where a complex vector of the input impedance of the transistor 227 is further advanced by $+90°$ or less appears at the emitter of the transistor 227. Accordingly, it is necessary that the frequency characteristic compensation impedance 83 is not at least capacitive in the frequency in which the gain is increased by the emitter peaking. When it is also considered that the emitter peaking is not effected, the frequency characteristic compensation impedance 83 can use an impedance exhibiting a negative resistance component from a certain frequency or more. Accordingly, the embodiment shown in FIG. 18E is feasible. In FIG. 18E, in order to prevent a DC impedance from having a negative resistivity and the stability of the circuit from collapsing, a series resistor 239 is connected to the FDNR 238. Further, it is also considered that a negative resistance component produced when the FDNR 238 is superior to the resistor 239 in the combined impedance in a high-frequency area that has any bad influence. In this case, it is effective that another parallel resistor is added to the FDNR 238 itself or between terminals 229 and 233. The FDNR 238 can be realized by a circuit using a high speed active element. Similarly, a further embodiment in which a negative resistance component occurs in a high frequency is shown in FIG. 18F. A frequency dependent negative conductance (FDNC) used in the embodiment of FIG. 18F has an impedance of $-1/(\omega \times \omega \times D)$. When it is necessary to prevent a DC impedance from having a negative resistivity, a resistor 241 is added in parallel to the FDNC 240. Further, to prevent the impedance in a high frequency from having a negative resistivity, a resistor is connected in series to the FDNC 240 or the frequency characteristic compensation impedance 83. Both of the embodiments of FIGS. 18E and 18F are common in that the negative impedance is realized. However, the embodiment shown in FIG. 18F is suitable for practical use in that the negative impedance thereof and the input impedance $Z_E$ are reduced with increase of the frequency and the Miller effect itself is suppressed.

Figure 19A:
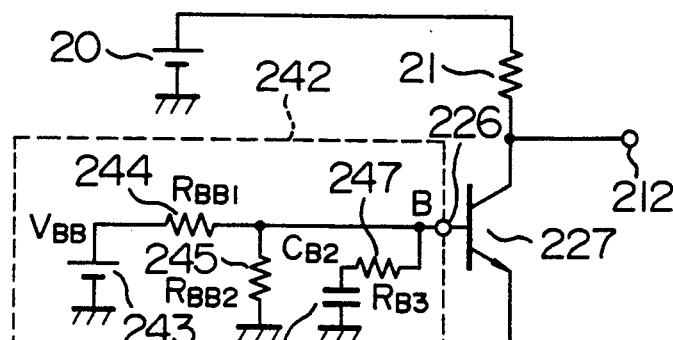
FIG. 19A is a circuit diagram showing a seventeenth embodiment of the present invention.
Figure 19B:
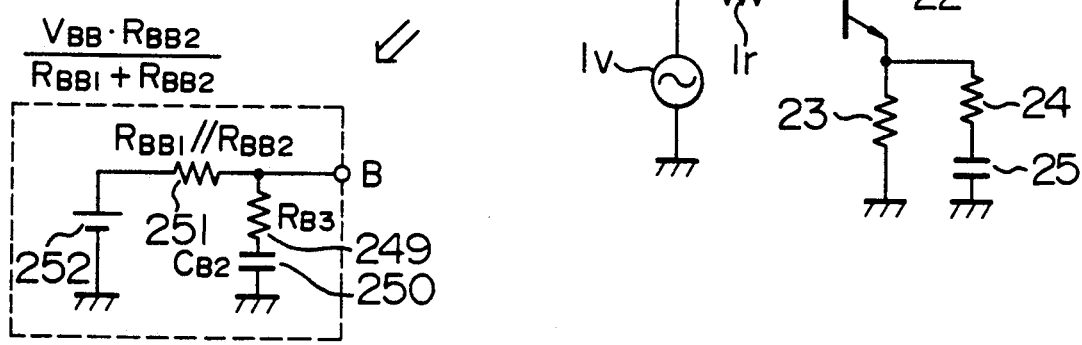
FIG. 19B is a circuit diagram showing an equivalent circuit of FIG. 19A.

FIG. 19A shows still another embodiment of the present invention. In the circuit shown in FIG. 19A, a circuit network composed of resistors 244, 245 and 247 and a capacitor 246 has an equivalent circuit as shown in FIG. 19B as viewed from the base electrode of a grounded-base transistor 227 and realizes the bias voltage source and the frequency characteristic compensation impedance of FIG. 17 equivalently. The equivalent impedance for the frequency characteristic compensation of the circuit shown in FIG. 19 corresponds to the configuration of FIG. 18B.

Figure 20:
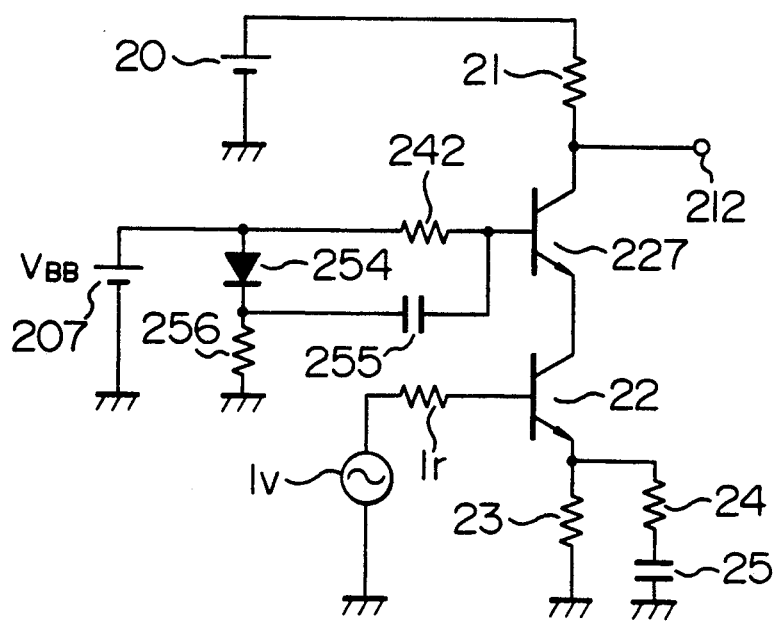
FIG. 20 is a circuit diagram showing an eighteenth embodiment of the present invention.

FIG. 20 shows an embodiment in which the diode 237 shown in FIG. 18D is not cut off by the backward base current of the grounded-base transistor 227 and a stable frequency characteristic compensation is attained. In FIG. 20, a bias current flows to a diode 254 to the extent that the backward current has no trouble. A resistor 256 is a bias resistor for setting the bias current. The diode 254 is connected to the base of the transistor 227 through a coupling capacitor 255. A resistor 242 supplies a DC base current to the transistor 227 and sets the base potential of the transistor 227 to a voltage $V_{BB}$ of a bias voltage source 207. Further, the diode 254 is replaced by a variable capacitance diode and its capacitance is controlled, so that the frequency characteristic can be controlled. As an application example of this case, the trap frequency fr is controlled to be matched to a frequency of an unnecessary signal so that the unnecessary signal can be removed.

Figure 21:
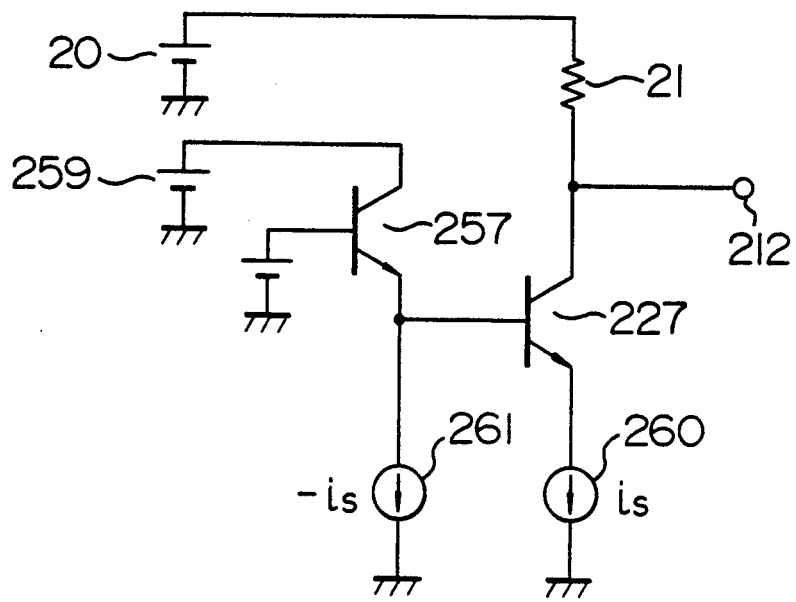
FIG. 21 is a circuit diagram showing a nineteenth embodiment of the present invention.

In the embodiment concerning the cascade amplifier circuit, only the case where a phase of the signal current flowing to the grounded-base transistor is within 90° or less with respect to a phase of the input signal voltage is considered. An embodiment in which the frequency characteristic can be always compensated for regardless of the phase of the signal current is shown in FIG. 21. In FIG. 21, the base of a grounded-base transistor 227 is biased by an emitter voltage of a grounded-base transistor 257 to which a current ($=i_s$) having the inverted phase of that of a signal current $i_s$ flowing to the grounded-base transistor 227 flows. Thus, the signal voltage appearing at the emitter of the transistor 227 is canceled by a negative-phase signal voltage appearing at the emitter of the transistor 257. It is optimum that an element having the same characteristics as the grounded-base transistor is used as the frequency characteristic compensation transistor 257, while all elements exhibiting an inductive input impedance in the trap frequency fr having the bad influence can be applied thereto. Accordingly, the magnitude and the phase of the negative-phase signal current $(-i_s)$ have the large degree of freedom and it is not necessary to obtain the inverted signal exactly. Further, as far as the above condition is satisfied, a voltage value of a collector voltage source 259 of the frequency characteristic compensation transistor 257 can be set freely. Accordingly, it is possible that the base and the collector of the transistor 257 can be short-circuited to form a diode connection, or the negative-phase signal current can flow to any diode to effect the frequency characteristic compensation.

Figure 22:
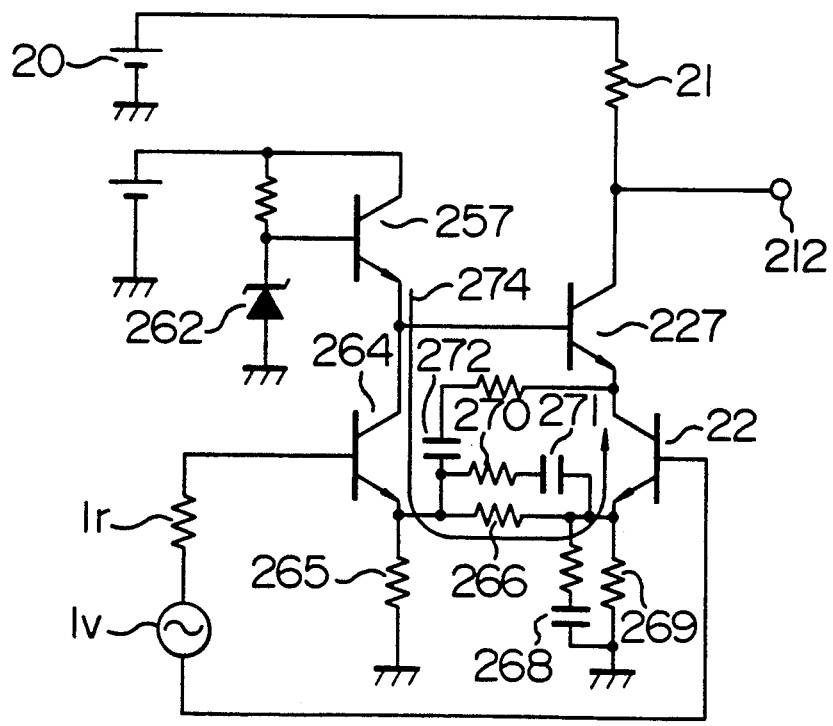
FIG. 22 is a circuit diagram showing a twentieth embodiment of the present invention.
Figure 23:
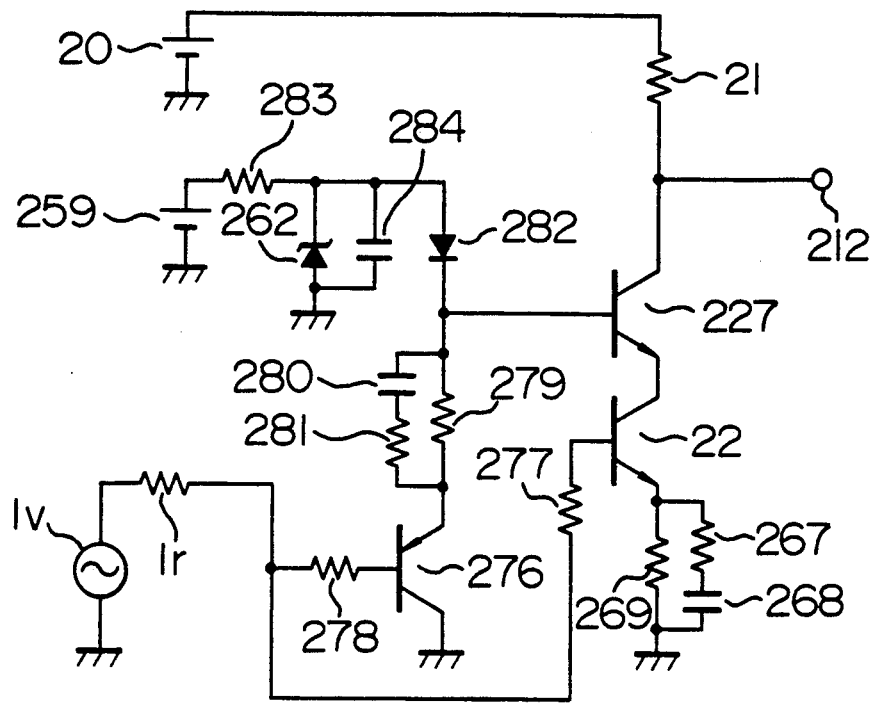
FIG. 23 is a circuit diagram showing a twenty-first embodiment of the present invention.

An embodiment in which the signal current sources 260 and 261 shown in FIG. 21 use a differential amplifier circuit is shown in FIG. 22. In FIG. 22, a signal of an input signal voltage source 1v is applied between the bases of the transistors 22 and 264 and is then applied to a resistor 266 to be converted into a signal current 274, so that the current flows to the grounded-base transistor 227 and the frequency characteristic compensation transistor 257 while maintaining a relation of the inverted phase to each other, that is, a relation that if $i_s$ is increased, $-i_s$ is reduced. Capacitors 268 and 272 are used for the emitter peaking and a capacitor 271 and a resistor 270 compensates for distortion upon transient response caused by a thermal time constant of the transistors 22 and 264. It is needless to say that the peaking current produced by the emitter peaking has also preferably an inverted phase between the transistors 227 and 257. Further, the temperature characteristic of a zener diode 262 for biasing the base of the transistor 257 can be set properly, so that the bias voltage of the transistor 227 can be compensated. It is apparent that temperature drift of the bias currents flowing to the transistors can be suppressed by replacing bias resistors 269 and 265 of the differential circuit by a constant current source. An embodiment including a combination of amplifier circuits each producing a signal current having a phase opposite to each other is shown in FIG. 23. In FIG. 23, a signal voltage source 1v is connected to the base of a grounded-emitter transistor 22 constituting a cascade amplifier circuit and the base of a transistor 276 constituting an emitter follower circuit for producing a negative-phase signal current. The negative-phase signal current of inversion of a signal current flowing to a transistor 227 flows to a diode 282 for the frequency characteristic compensation by setting peaking elements 267, 268, 269 and 279 properly to make equal the emitter peaking characteristics of the transistors 22 and 276 generally. It is needless to say that the diode can be replaced by a series circuit of a resistor and a coil. Further, by using the diode 282 as the frequency characteristic compensation element, the negative-phase signal current which is large to the extent that it cannot be neglected is to flow to the zener diode 262 as compared with a current flowing through a bias resistor from a bias voltage source 259, a capacitor 284 serves to bypass the negative-phase signal current. Another large feature of the embodiment is that the transistor 276 for obtaining the negative-phase signal current suppresses the Miller effect even in an input of the transistor since it constitutes the emitter follower circuit as described above.

Figure 24:
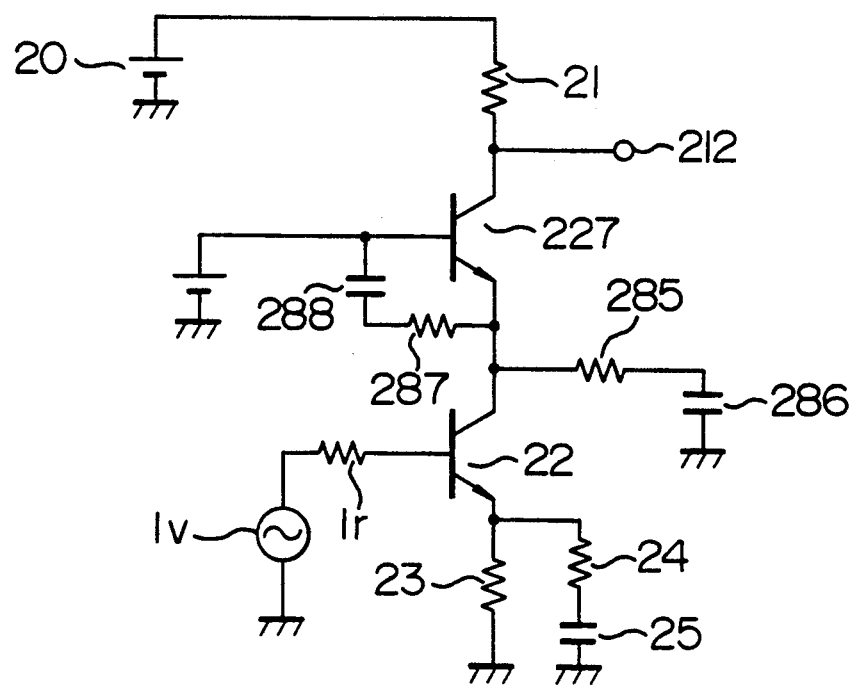
FIG. 24 is a circuit diagram showing a twenty-second embodiment of the present invention.

The foregoing embodiments capable of achieving the second object of the present invention require the relatively expensive semiconductor elements such as transistors. An embodiment capable of achieving the above objective slightly less expensively is shown in FIG. 24. In FIG. 24, by using at least one of damping resistors 287 and 285, Q of an inductance component included in an input impedance of the emitter of the grounded-base transistor 227 is suppressed. Accordingly, Q in the resonance can be damped. Further, the capacitors 288 and 286 serve to prevent a DC current from flowing through the damping resistors 287 and 285, respectively. However, when the DC current is relatively small and it is not necessary to prevent the DC current, the capacitors 288 and 286 can be short-circuited to remove them.

As an embodiment for damping the Q without using the configuration shown in FIG. 24, there is considered a method in which a resistor having a value reduced to the extent that the Miller effect produced in the transistor 22 has no trouble is connected in series to the emitter of the transistor 227. Further, the trap frequency fr can be removed outside of the signal band by driving parallelly a plurality of grounded-base transistors to parallel input impedances of the grounded-base amplifier circuits.

The foregoing description has been directed to embodiments capable of eliminating or suppressing the trap occurring in the input frequency characteristic of the cascade amplifier circuit. The frequency characteristic of the amplifier circuit or the whole signal processing system including the amplifier circuit can be varied by changing the various frequency characteristic compensation impedance used in the embodiments. Further, it is needless to say that by constituting the frequency characteristic compensation impedance and at least two elements of the grounded-base transistors or the grounded-emitter transistors constituting the cascade amplifier circuit by a single chip integrated circuit, the matching therebetween is ensured and the frequency characteristic compensation accuracy is improved.

Figure 25A:
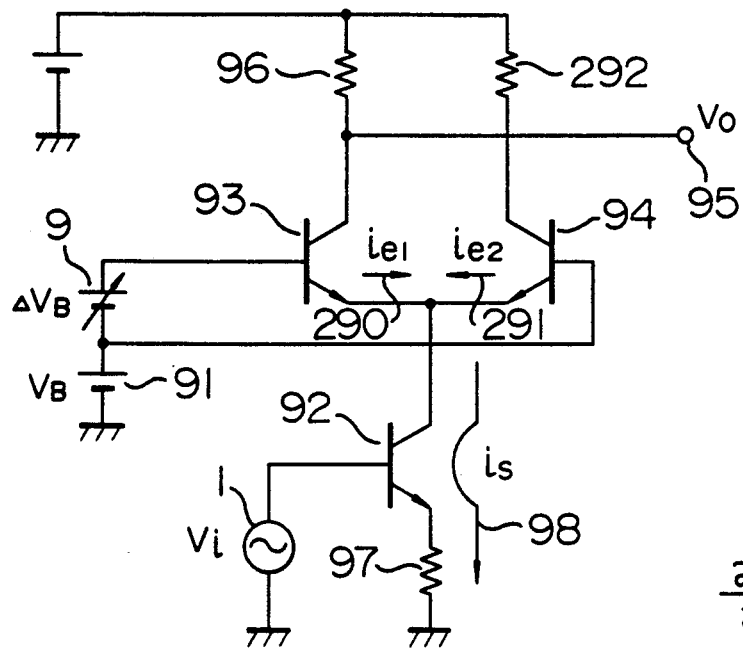
FIG. 25A is a circuit diagram showing a common variable gain amplifier circuit.
Figure 25B:
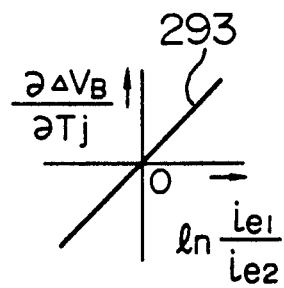
FIG. 25B is a diagram showing a temperature coefficient required for a control voltage.
Figure 26:
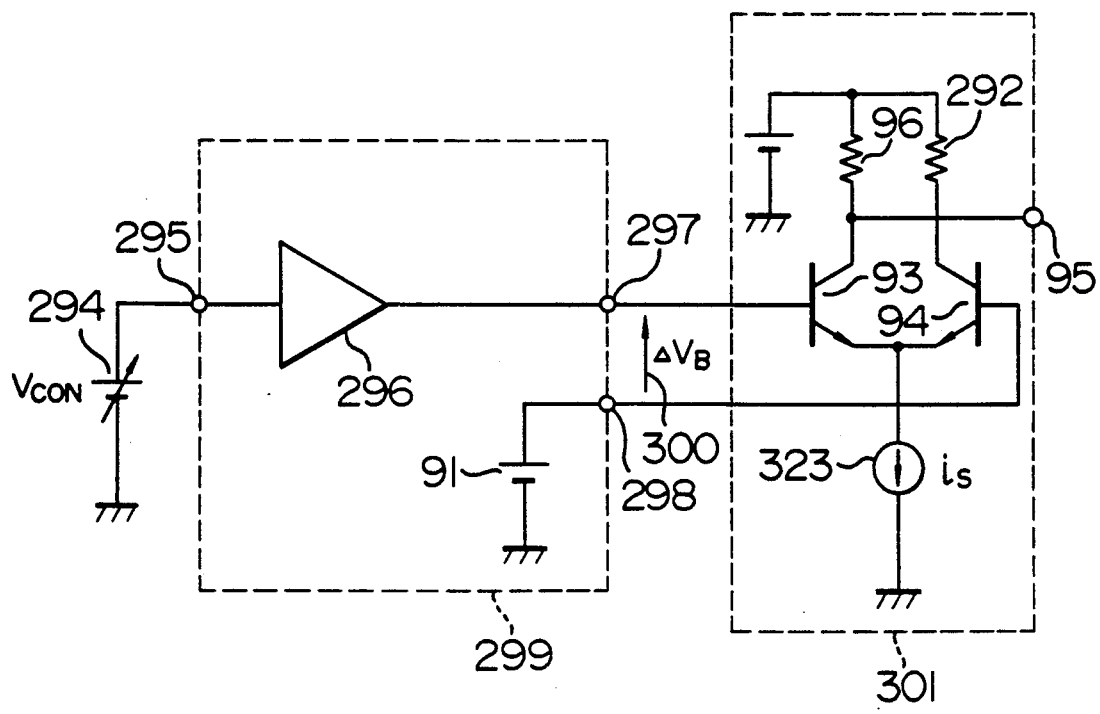
FIG. 26 is a circuit diagram showing a twenty-third embodiment of the present invention.

An embodiment of a control circuit suitable of control of a variable gain amplifier circuit and having a temperature coefficient of a control voltage varying in accordance with the control voltage is shown in FIG. 26. A control signal source 294 is connected to an input terminal 295 of a control circuit 299 shown in FIG. 26 and a voltage between output terminals 297 and 298 of the control circuit 299 is a gain control voltage of a variable gain amplifier circuit 301. The control circuit 299 includes a control voltage and temperature coefficient varying circuit 296 which produces a control voltage in accordance with an input control signal and in which a temperature coefficient of the control voltage is varied in accordance with the input control voltage and a reference voltage source 91. Further, the variable gain amplifier circuit 301 includes a signal current source 323, a pair of differential transistors 93 and 94 for dividing a signal current $i_s$ and a resistor 96 for converting a signal current having an amplitude controlled by changing a ratio of dividing the $i_s$ into an output signal voltage. A resistor 292 is used to equalize the power consumption of the transistors 93 and 95 constituting the differential pair so as to improve control accuracy. By using the embodiment shown in FIG. 26, a temperature coefficient of a value $\Delta V_B$ of the control voltage 300 can be set as shown by the characteristic 293 of FIG. 25B and temperature stability in gain control is improved. The characteristic 293 shows a temperature characteristic of the control voltage required so that a gain of an amplifier circuit of a succeeding stage is not influenced by the temperature drift. The circuit 299 of FIG. 26 can be applied as the control circuit of 7R, 7G and 7B of FIG. 13. In FIG. 26, however, the reference voltage source 91 shown in the control circuit 299 may be provided outside of the control circuit or in the variable gain amplifier circuit 301. Furthermore, even if the transistors 93 and 94 constituting the differential pair in the variable gain amplifier circuit 301 are formed by using active elements except bipolar transistors such as FET's and the temperature coefficient necessary for the value $\Delta V_B$ of the control voltage 300 is different from the characteristic shown in FIG. 25B, the embodiment is applicable. It is needless to say that an object to be controlled by the control circuit 299 is limited to the variable gain amplifier circuit. Accordingly, an amount of temperature drift of the control voltage 300 produced from the control circuit 29 of the present invention can be detected to constitute a temperature detection system.

Figure 27:
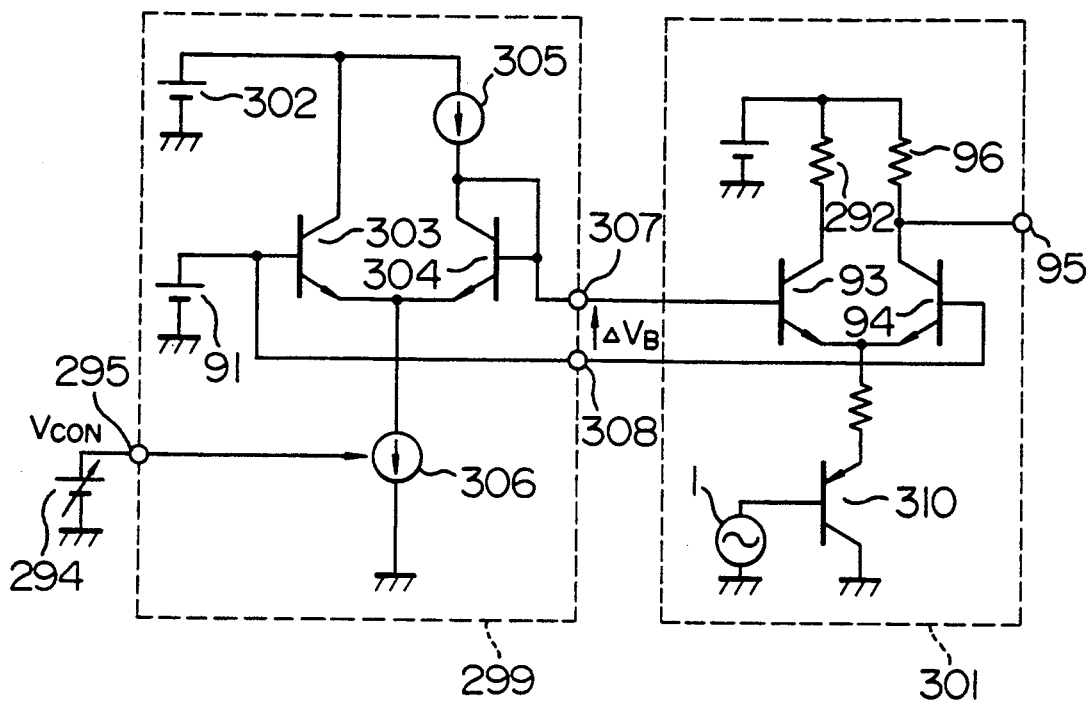
FIG. 27 is a circuit diagram showing a twenty-fourth embodiment of the present invention.

Another embodiment of the control circuit 299 is shown in FIG. 27. In FIG. 27, the base of a transistor 303 in the control circuit 299 and the base of the transistor 94 constituting the differential pair in the variable gain amplifier circuit 301 are biased by a reference voltage source 91. A current of a current source 306 controlled by a control signal $V_{CON}$ of the control voltage source 294 is divided to flow through a transistor 303 and a transistor 304, the latter configured as a diode. However, since a current flowing through the transistor 304 is made constant by a current source 305, a current flowing through the transistor 303 is controlled to a fixed value by the current control of the current source 306. Accordingly, the current ratio in the transistors 303 and 304 is made constant and at the same time the division ratio in the transistors 94 and 93 is also controlled to the same ratio as the current ratio to cancel the temperature drift. Further, it is needless to say that the same control operation can be obtained by controlling the current of the current source 305. A transistor 310 in the variable gain amplifier circuit 301 serves to convert the signal voltage of the signal source 1 into a signal current and flow the signal current to the transistors 93 and 94.

Figure 28:
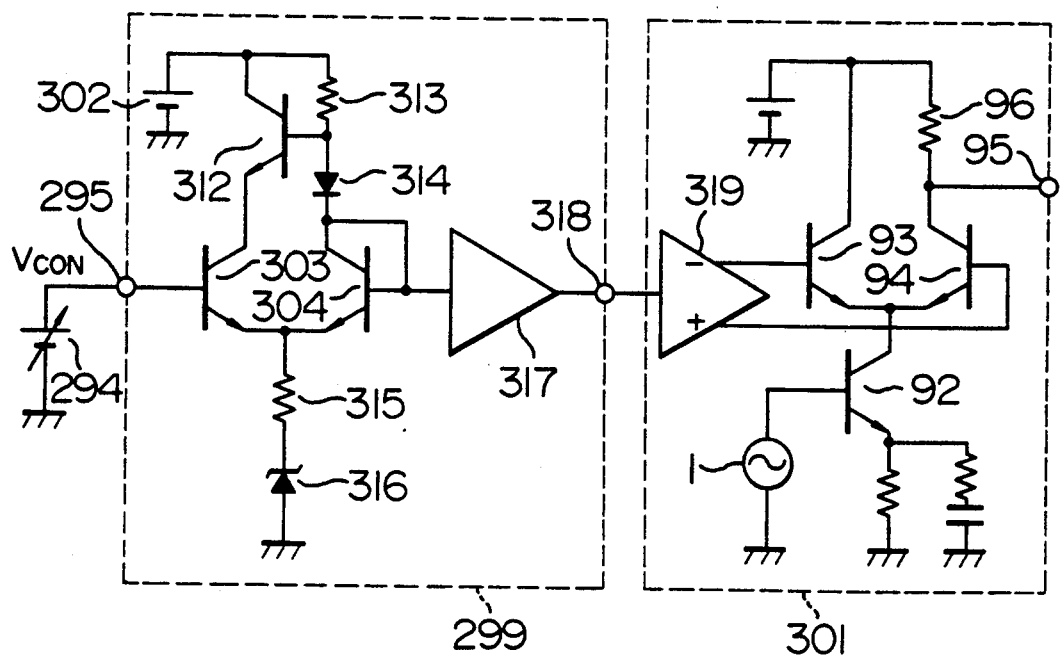
FIG. 28 is a circuit diagram of a twenty-fifth embodiment of the present invention.

A still further embodiment of the control circuit 299 is shown in FIG. 28. In FIG. 28, the control signal $V_{CON}$ is supplied to the base of the transistor 303 in the control circuit 299 to control the current ratio in the transistors 303 and 304. That is, when the control voltage $V_{CON}$ is, for example, increased, a voltage applied across a resistor 313 is made small and a current flowing through the transistor 304 is reduced. Further, at this time, since a voltage applied across a resistor 315 is increased, a current flowing through the transistor 303 is increased. A transistor 312 and a diode 314 serve to reduce a difference in consumption power between the transistors 303 and 304. Accordingly, when a difference in a collector voltage between the transistors 303 and 304 can be suppressed to a relatively small value to ensure a necessary control accuracy, the diode 314 can be replaced by a resistor or short-circuited to eliminate the diode. In such a case, it is needless to say that the transistor 312 can be removed and the collector of the transistor 303 can be connected to the power source 302. A zener diode 316 compensates for temperature drift of the current ratio therebetween occurring due to temperature drift occurring in the current for the transistors 303 and 304. Further, a desired temperature drift can occur in the current ratio by selecting the temperature characteristic of the zener diode 316 properly. For example, when a single control terminal of the variable gain amplifier 301 is employed as shown in FIG. 28 and the differential pair transistors 93 and 94 must be controlled through a differential control voltage generation circuit 319, an output operation point and a gain of an amplifier circuit 317 in the control circuit 299 are adjusted so that the division ratio in the transistors 93 and 94 is compensated in temperature. As an example of an adjustment method in this case, the current ratio of the transistors 303 and 304 in the control circuit 299 is set to 1:1 to reduce the temperature coefficient of the control voltage to zero and the output operation point of the amplifier circuit 317 is adjusted so that the division ratio in the differential pair transistors 93 and 94 in the variable gain amplifier circuit 301 is 1 to 1. Then, the gain of the amplifier circuit 317 is adjusted or resistance values of the resistors 315 and 313 are adjusted so that the temperature drift does not occur in the point in which a variable gain amount of the variable gain amplifier circuit 301 is maximized.

The foregoing description has been made to the embodiment of the control circuit suitable for control of the variable gain amplifier circuit, while it is needless to say that the temperature stability of the circuit is further improved by forming at least parts of the control circuit of the present invention and the variable gain amplifier circuit controlled by the control circuit on the same integrated circuit chip.

Figure 29:
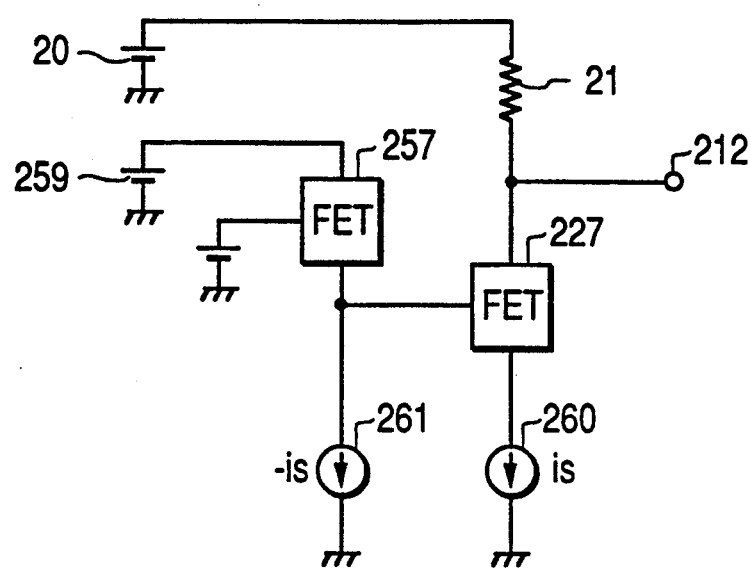
FIGS. 29 and 30 are circuit diagrams showing twenty-sixth and twenty-seventh embodiments of the present invention.
Figure 30:
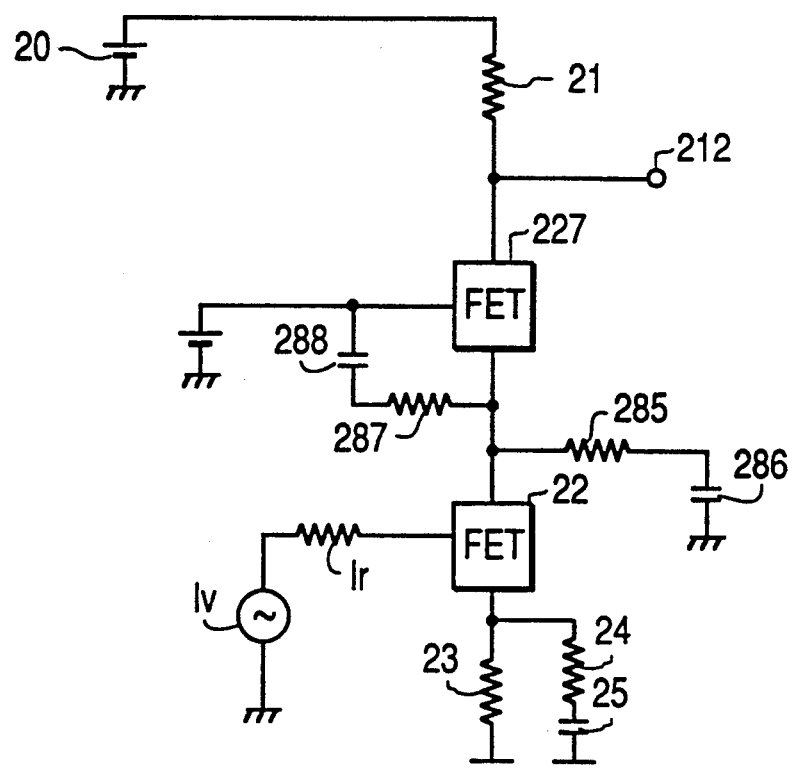

Finally, all of active elements used in the embodiments of the present invention described so far are not limited to bipolar transistors and can be replaced by FETs or vacuum tubes. Examples of using FETs in place of bipolar transistors, such as with respect to FIGS. 21 and 24, are illustrated in FIGS. 29 and 30, respectively. Further, the polarity of the active elements can be inverted.

We claim:

1. An amplifier circuit comprising:
   an amplification element with a controllable gain having a first terminal to which a signal is supplied and a second terminal from which an output signal is produced; and
   a circuit block including voltage generation means, comprised of an active element, and variable impedance means for varying the gain of said amplification element, said voltage generation means and said variable impedance means being connected in series, and said circuit block being connected between a reference voltage and a third terminal of said amplification element.

2. An amplifier circuit comprising:
   an amplification element with a controllable gain having a first terminal to which a signal is supplied and a second terminal from which an output signal is produced; and
   a circuit block including voltage generation means, comprised of an active element, and variable impedance means for varying the gain of said amplification element, said voltage generation means and said variable impedance means being connected in series, and said circuit block being connected between a reference voltage and said second terminal of said amplification element.

3. An amplifier circuit comprising:
   a first conversion circuit including a first active element and for converting an input signal into a first signal current;
   a second conversion circuit including a second active element and for transmitting said first signal current to an output thereof;
   a variable impedance means for converting said first signal current transmitted to said output into a voltage; and
   a circuit block including voltage generation means connected in series to said variable impedance means and having a terminal connected to the output of said second conversion circuit.

4. An amplifier circuit according to claim 3, further comprising division means connected to an output of said second conversion circuit for dividing an output current of said second conversion circuit into a plurality of current paths.

5. An amplifier circuit according to claim 4, wherein said division means comprises an impedance element.

6. An amplifier circuit according to claim 4, wherein said division means comprises a constant current source circuit.

7. An amplifier circuit according to claim 3, wherein a first terminal of said first active element is connected to an input signal source, and a second terminal of said first active element is connected to a junction of said variable impedance means and said voltage generation means, a third terminal of said first active element is connected to an input terminal of said second active element, and said output terminal of said second active element is connected to said output terminal of said second conversion circuit.

8. An amplifier circuit according to claim 7, wherein said first active element includes a transistor.

9. An amplifier circuit according to claim 7, wherein said first conversion circuit includes a grounded-collector transistor circuit.

10. An amplifier circuit according to claim 7, wherein said first conversion circuit includes a grounded-emitter transistor circuit.

11. An amplifier circuit according to claim 7, wherein said second active element comprises a transistor.

12. An amplifier circuit according to claim 7, wherein said second conversion circuit comprises a grounded-base transistor circuit.

13. An amplifier circuit according to claim 3, further comprising a capacitor connected in parallel to said voltage generation means.

14. An amplifier circuit according to claim 3, wherein said voltage generation means comprises a circuit including a resistor.

15. An amplifier circuit according to claim 3, further comprising:
means coupled to the output of said second conversion circuit and for shifting an input-output signal voltage characteristic line of an amplifier circuit in a direction parallel to itself, such that said characteristic line goes through an operation point which can be optionally set to on said input-output signal voltage characteristic line.

16. An amplifier circuit comprising voltage generation means having a terminal maintained to a predetermined potential and being connected to a base of a transistor constituting a grounded-base circuit through a circuit including a negative impedance.

17. An amplifier circuit comprising:
a transistor forming a grounded-base circuit;
an impedance circuit comprising a series circuit of a resistor and a capacitor; and
voltage generation means having a terminal maintained at a predetermined potential,
wherein said transistor has a base connected to said terminal of said voltage generation means via said impedance circuit so that said base is grounded for AC signal components,
wherein an input signal is applied between said base ad an emitter of said transistor via said impedance circuit, and
wherein an output signal is obtained between said base and a collector of said transistor via said impedance circuit.

18. An amplifier circuit comprising:
a first transistor constituting a grounded-base circuit;
a second transistor having an emitter connected to a base of said first transistor;
current generation means connected to the emitter of said second transistor; and
means for controlling a current flowing from said current generation means such that a direction of variation of a signal current component included in said current is opposite to a direction of variation of another signal current component which flows into an emitter of said first transistor.

19. An amplifier circuit according to claim 18, wherein each of said transistors includes an FET.

20. An amplifier circuit according to claim 18, wherein said second transistor is configured as a diode.

21. A video signal processing circuit comprising:
a first conversion circuit including a first active element and for converting an input signal supplied at an input thereof into a first signal current;
a second conversion circuit including a second active element and for transmitting said first signal current to an output thereof;
variable impedance means for converting said first signal current transmitted to output side into a voltage; and
an amplifier circuit including a circuit block having voltage generation means connected in series to said variable impedance means and a terminal connected to the output of said second conversion circuit.

22. A video signal processing circuit according to claim 21, further comprising division means connected to an output of said second conversion circuit for dividing an output current of said second conversion circuit into a plurality of current paths.

23. An amplifier circuit according to claim 22, wherein said division means comprises an impedance element.

24. An amplifier circuit according to claim 22, wherein said division means comprises a constant current source circuit.

25. A video signal processing circuit according to claim 21, wherein a first terminal of said first active element is connected to an input signal source, a second terminal of said first active element is connected to a junction of said variable impedance means and said voltage generation means, a third terminal of said first active element is connected to an input terminal of said second active element, and said output terminal of said second active element is connected to said output terminal of said second conversion circuit.

26. A video signal processing circuit according to claim 21, wherein said first active element includes a transistor.

27. A video signal processing circuit according to claim 21, wherein said first conversion circuit includes a grounded-collector circuit.

28. A video signal processing circuit according to claim 21, wherein said first conversion circuit includes a grounded-emitter circuit.

29. A video signal processing circuit according to claim 21, further comprising a capacitor connected in parallel to said voltage generation means.

30. A video signal processing circuit according to claim 21, further comprising another amplifier circuit including voltage generation means having one terminal maintained at a predetermined potential and connected to a base of a transistor constituting a grounded-base circuit through a circuit including a parallel circuit of at least a resistor and a capacitor.

31. A video signal processing circuit according to claim 21, further comprising another amplifier circuit including voltage generation means having one terminal maintained at a predetermined potential and connected to a base of a transistor constituting a grounded-base circuit through a circuit including a non-linear element.

32. A video signal processing circuit according to claim 21, further comprising another amplifier circuit including voltage generation means having one terminal maintained at a predetermined potential and connected to a base of a transistor constituting a grounded-base circuit through a circuit including a negative impedance.

33. A video signal processing circuit according to claim 21, further comprising:
a transistor forming a grounded-base circuit;

an impedance circuit comprising a series circuit of a resistor and a capacitor; and voltage generation means having a terminal maintained at a predetermined potential, wherein said transistor has a base connected to said terminal of said voltage generation means via said impedance circuit, and wherein an input signal is applied between said base and an emitter of said transistor via said impedance circuit.

34. A video signal processing circuit according to claim 21, further comprising:

a differential circuit including a third active element having first, second and control terminals and a fourth active element having first, second and control terminals, the first terminal of said fourth active element being connected to the first terminal of said third active element; and a signal processing circuit including variable current generation means connected to the connection, which forms a common junction, of said third and fourth active elements and controlled by an external control signal, a gain control signal of a variable gain amplifier circuit of a succeeding stage being produced from a common junction of the second and control terminals of said fourth active element, said variable gain amplifier circuit of said succeeding stage generating at an output thereof a processed signal which is supplied as said input signal to said first conversion circuit 35. A video signal processing circuit according to claim 21, further comprising:

a signal processing circuit including a differential circuit including first terminals of third and fourth active elements connected to each other, an external control signal being supplied to a second terminal of said third active element, a gain control signal of a variable gain amplifier circuit of a succeeding stage being produced from a common junction of second and third terminals of said fourth active element, said variable gain amplifier circuit of said succeeding stage generating at an output thereof a processed signal which is supplied as said input signal to said first conversion circuit.

36. A video signal processing circuit according to claim 21, wherein said second active element comprises a transistor.

37. A video signal processing circuit according to claim 21, wherein said second conversion circuit comprises a grounded-base transistor circuit.

38. A video signal processing circuit according to claim 21, further comprising:

means coupled to the output of said second conversion circuit and for shifting an input-output signal voltage characteristic line of a video amplifier circuit in a direction parallel to itself, such that said characteristic line goes through an operation point which can be optionally set to on said input-output signal voltage characteristic line.

39. A video signal processing circuit comprising:

an amplification element with a controllable gain having a first terminal to which a signal is supplied and a second terminal from which an output signal is produced; and a circuit block including voltage generation means, comprised of an active element, and variable impedance means for varying the gain of said amplification element, said voltage generation means and said variable impedance means being connected in series, and said circuit block being connected between a reference voltage and a third terminal of said amplification element.

40. A video signal processing circuit comprising:

an amplification element with a controllable gain having a first terminal to which a signal is supplied and a second terminal from which an output signal is produced; and a circuit block including voltage generation means, comprised of an active element, and variable impedance means for varying a gain of said amplification element, said voltage generation means and said variable impedance means being connected in series, and said circuit block being connected between a reference voltage and said second terminal of said amplification element.

41. An amplifier circuit comprising:

an output terminal for outputting an output signal voltage;

a conversion circuit for converting an input signal voltage into a signal current, comprising:

an input terminal connected to an input signal source, a first output terminal connected to said output terminal, a second output terminal, and an active element having a first terminal connected to said input terminal and a second terminal connected to said second output terminal, wherein a flow direction of variation of a signal current component from said first output terminal is inverse with respect to a flow direction of variation of a signal current component from said second output terminal;

a variable impedance means for converting said signal current into said output signal voltage, said variable impedance means connected between said first output terminal of said conversion circuit and said second output terminal of said conversion circuit; and an impedance circuit connected between said second output terminal of said conversion circuit and a reference voltage.

42. An amplifier circuit according to claim 41, further comprising a capacitor connected in parallel with said impedance circuit.

43. An amplifier circuit according to claim 41, further comprising dividing means, connected to said first output terminal of said conversion circuit, for dividing said signal current into a plurality of current paths.

* * * * *